(12) United States Patent
Schaller et al.

(10) Patent No.: US 7,883,629 B2
(45) Date of Patent: Feb. 8, 2011

(54) TECHNIQUE FOR PATTERNING DIFFERENTLY STRESSED LAYERS FORMED ABOVE TRANSISTORS BY ENHANCED ETCH CONTROL STRATEGIES

(75) Inventors: Matthias Schaller, Moritzburg OT Boxdorf (DE); Heike Salz, Radebeul (DE); Ralf Richter, Dresden (DE); Sylvio Mattick, Ralbitz-Rosenthal OT Laske (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 548 days.

(21) Appl. No.: 11/868,789

(22) Filed: Oct. 8, 2007

(65) Prior Publication Data

US 2008/0206905 A1    Aug. 28, 2008

(30) Foreign Application Priority Data

Feb. 28, 2007    (DE) ..................... 10 2007 009 901

(51) Int. Cl.
*C03C 15/00* (2006.01)
*G01R 31/00* (2006.01)
*H01L 21/00* (2006.01)
*H01L 21/66* (2006.01)

(52) U.S. Cl. ............................. 216/58; 216/59; 216/60; 438/7; 438/16

(58) Field of Classification Search ................... 216/58, 216/13; 438/6, 7, 8, 14, 16, 142, 309, 584, 438/758, 689

See application file for complete search history.

(56) References Cited

U.S. PATENT DOCUMENTS 4,927,485 A    5/1990  Cheng et al. ................ 156/345

6,226,086 B1    5/2001  Holbrook et al. ............ 356/381

(Continued)

FOREIGN PATENT DOCUMENTS

DE    102004026149    12/2005

(Continued)

OTHER PUBLICATIONS

"Technologie hochintegrierter Schaltungen" by D. Widmann, et al, Mit 208 Abbildunger und 29 Tabellen (no translation).

(Continued)

*Primary Examiner*—Shamim Ahmed
*Assistant Examiner*—Patti Lin
(74) *Attorney, Agent, or Firm*—Williams, Morgan & Amerson, P.C.

(57) ABSTRACT

During the patterning of stressed layers having different types of intrinsic stress, the effects of the deposition of a silicon dioxide based etch indicator material between the first and second dielectric layers may be significantly reduced by a controlled etch on the basis of optical measurement data indicating the etch rate and, thus, the performance of the respective etch process. In other cases, highly efficient etch indicator species may be incorporated into the stressed dielectric layers or may be formed on a surface portion thereof with reduced layer thickness, thereby providing an enhanced endpoint detection signal without creating the negative effects of silicon dioxide based indicator layers. In one illustrative embodiment, a stressed silicon, nitrogen and carbon-containing layer may be combined with a stressed silicon and nitrogen-containing layer, wherein the carbon species provides a prominent endpoint detection signal.

18 Claims, 10 Drawing Sheets

U.S. PATENT DOCUMENTS

| | | | |
|---|---|---|---|
| 6,258,497 B1 | 7/2001 | Kropp et al. | 430/30 |
| 6,383,824 B1 | 5/2002 | Lensing | 438/14 |
| 6,433,871 B1 | 8/2002 | Lensing et al. | 356/381 |
| 6,602,723 B1 | 8/2003 | Markle et al. | 438/5 |
| 6,643,557 B1 | 11/2003 | Miller et al. | 700/110 |
| 6,660,543 B1 | 12/2003 | Stirton et al. | 438/16 |
| 6,707,562 B1 | 3/2004 | Lensing | 356/630 |
| 6,716,646 B1 * | 4/2004 | Wright et al. | 438/14 |
| 6,742,168 B1 | 5/2004 | Nariman | 716/4 |
| 6,785,009 B1 | 8/2004 | Stirton et al. | 356/625 |
| 6,790,570 B1 | 9/2004 | Stirton et al. | 430/30 |
| 6,791,697 B1 | 9/2004 | Nariman | 356/603 |
| 6,795,193 B2 | 9/2004 | Schulz | 356/445 |
| 6,855,645 B2 * | 2/2005 | Tang et al. | 438/778 |
| 6,881,594 B1 | 4/2005 | Stirton et al. | 438/14 |
| 6,933,158 B1 | 8/2005 | Lensing et al. | 438/16 |
| 6,989,900 B1 | 1/2006 | Stirton | 356/445 |
| 2002/0119660 A1 * | 8/2002 | Sarfaty et al. | 438/689 |
| 2003/0211746 A1 * | 11/2003 | Chen et al. | 438/700 |
| 2004/0029323 A1 * | 2/2004 | Shimizu et al. | 438/142 |
| 2006/0033095 A1 | 2/2006 | Doyle et al. | 257/19 |
| 2006/0091471 A1 * | 5/2006 | Frohberg et al. | 257/369 |
| 2006/0226490 A1 | 10/2006 | Burnett et al. | 257/365 |

FOREIGN PATENT DOCUMENTS

| | | |
|---|---|---|
| DE | 102007004883 A1 | 8/2008 |
| EP | 1 111 356 A2 | 6/2001 |

OTHER PUBLICATIONS

PCT Search Report from PCT/US2008/002663 dated Oct. 22, 2008.
Translation of Official Communication for German Patent Application No. 10 2007 009 901.2-33 dated Sep. 5, 2010.

* cited by examiner

TECHNIQUE FOR PATTERNING DIFFERENTLY STRESSED LAYERS FORMED ABOVE TRANSISTORS BY ENHANCED ETCH CONTROL STRATEGIES

BACKGROUND OF THE INVENTION

1. Field of the Invention

Generally, the present disclosure relates to the field of integrated circuits, and, more particularly, to the manufacture of field effect transistors on the basis of stressed dielectric layers formed above the transistors, such as stressed contact etch stop layers used for generating a different type of strain in channel regions of different transistor types.

2. Description of the Related Art

Integrated circuits are typically comprised of a large number of circuit elements located on a given chip area according to a specified circuit layout, wherein, in complex circuits, the field effect transistor represents one predominant circuit element. Generally, a plurality of process technologies are currently practiced, wherein, for complex circuitry based on field effect transistors, such as microprocessors, storage chips and the like, CMOS technology is currently one of the most promising approaches due to the superior characteristics in view of operating speed and/or power consumption and/or cost efficiency. During the fabrication of complex integrated circuits using CMOS technology, millions of complementary transistors, i.e., N-channel transistors and P-channel transistors, are formed on a substrate including a crystalline semiconductor layer. A field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of the MOS transistors. Thus, the reduction of the channel length, and associated therewith the reduction of the channel resistivity, renders the channel length a dominant design criteria for accomplishing an increase in the operating speed of the integrated circuits.

The shrinkage of the transistor dimensions, however, involves a plurality of issues associated therewith that have to be addressed so as to not unduly offset the advantages obtained by steadily decreasing the channel length of MOS transistors. One issue associated with reduced gate lengths is the occurrence of so-called short channel effects, which may result in a reduced controllability of the channel conductivity. Short channel effects may be countered by certain design techniques, some of which, however, may be accompanied by a reduction of the channel conductivity, thereby partially offsetting the advantages obtained by the reduction of critical dimensions.

In view of this situation, it has been proposed to enhance device performance of the transistor elements not only by reducing the transistor dimensions but also by increasing the charge carrier mobility in the channel region for a given channel length, thereby increasing the drive current capability and thus transistor performance. For example, the lattice structure in the channel region may be modified, for instance by creating tensile or compressive strain therein, which results in a modified mobility for electrons and holes, respectively. For example, creating tensile strain in the channel region of a silicon layer having a standard crystallographic configuration may increase the mobility of electrons, which in turn may directly translate into a corresponding increase of the conductivity of N-type transistors. On the other hand, compressive strain in the channel region may increase the mobility of holes, thereby providing the potential for enhancing the performance of P-type transistors.

One promising approach in this respect is a technique that enables the creation of desired stress conditions within the channel region of different transistor elements by adjusting the stress characteristics of a contact etch stop layer that is formed above the basic transistor structure in order to form contact openings to the gate and drain and source terminals in an interlayer dielectric material. The effective control of mechanical stress in the channel region, i.e., effective stress engineering, may be accomplished by individually adjusting the internal stress in the contact etch stop layer of the respective transistor in order to position a contact etch stop layer having an internal compressive stress above a P-channel transistor while positioning a contact etch stop layer having an internal tensile strain above an N-channel transistor, thereby creating compressive and tensile strain, respectively, in the respective channel regions.

Typically, the contact etch stop layer is formed by plasma enhanced chemical vapor deposition (PECVD) processes above the transistor, i.e., above the gate structure and the drain and source regions, wherein, for instance, silicon nitride may be used due to its high etch selectivity with respect to silicon dioxide, which is a well-established interlayer dielectric material. Furthermore, PECVD silicon nitride may be deposited with a high intrinsic stress, for example, up to 2 Giga Pascal (GPa) or significantly higher of compressive stress and up to 1 GPa and significantly higher of tensile stress, wherein the type and the magnitude of the intrinsic stress may be efficiently adjusted by selecting appropriate deposition parameters. For example, ion bombardment, deposition pressure, substrate temperature, gas components and the like represent respective parameters that may be used for obtaining the desired intrinsic stress.

During the formation of the two types of stressed layers, conventional techniques may suffer from reduced efficiency when device dimensions are increasingly scaled using the 65 nm technology and even further advanced approaches, as will be explained in more detail with reference to FIGS. 1*a*-1*c*.

FIG. 1*a* schematically illustrates a cross-sectional view of a semiconductor device 100 in a certain manufacturing stage for forming stress-inducing layers above a first device area 110 and a second device area 120. The first and second device areas 110, 120 which typically represent respective transistor elements may be formed above a substrate 101 comprising a semiconductor layer 102, such as a silicon-based layer, which may be separated from the substrate 101 by an appropriate buried insulating layer if a silicon-on-insulator (SOI) configuration is considered. In the example shown, the second device area 120 may comprise a plurality of transistor elements, while only a single transistor is illustrated in the first device region 110. The transistors in the second device region 120 may comprise a gate electrode 121 formed on respective gate insulation layers 123, which separates the gate electrode 121 from a corresponding channel region 124, which is laterally located between respective drain/source regions 125. Furthermore, a sidewall spacer structure 122 may be formed on sidewalls of the gate electrode 121. Typically, metal silicide regions (not shown) may be provided in the drain and source regions 125 and the gate electrodes 121 in order to enhance the conductivity of these areas. The semiconductor device 100 may represent an advanced device, in which critical dimensions, such as the gate length, i.e., in FIG. 1a the horizontal extension of the gate electrodes 121, may be approximately 50 nm or significantly less. Consequently, a distance between respective transistor elements, i.e., the lateral distance between neighboring sidewall spacer structures 122 of closely spaced transistor elements, may be approximately 100 nm or even less, wherein, depending on the device configuration, in dense device areas, a plurality of closely spaced circuit elements may be provided.

In the first device region 110, the respective transistor element may have a similar configuration and may represent a transistor of a different conductivity type compared to the transistors in the second device region 120, depending on the device requirements. Thus, a respective gate electrode 111 formed on a gate insulation layer 113, separating the gate electrode 111 from a channel region 114, may be provided. A spacer sidewall structure 112 may be formed on sidewalls of the gate electrode 111, and respective drain/source regions 115 may be formed in the semiconductor layer 102. It should be appreciated that the first and second device regions 110, 120 may be separated by an appropriate isolation structure (not shown) if required. Furthermore, in the manufacturing stage shown in FIG. 1a, a silicon nitride layer 130 comprising a high intrinsic stress may be formed above the first and second device regions 110, 120 followed by an etch indicator layer 131 comprised of silicon dioxide. It should be appreciated that, if required, an etch stop layer (not shown), such as a silicon dioxide layer of appropriate thickness and density, may be provided between the silicon nitride layer 130 and the respective transistor elements in the first and second device regions 110, 120.

As is evident from FIG. 1a, due to the reduced spacing between neighboring transistor elements, as is for instance shown in the second device area 120, the silicon nitride layer 130 may define a respective surface topography in which tapered recesses, also referred to as seams 131, may be formed between the closely spaced transistor elements, since the spacing between the transistor elements may be on the order of two times a layer thickness of the silicon nitride layer 130. Thus, due to the pronounced surface topography at the seam 131, the silicon dioxide layer 132 may have a significantly increased thickness at this area due to locally different deposition conditions compared to other areas, which may result in significant etch non-uniformities, as will be described with reference to FIG. 1b.

Furthermore, in this manufacturing stage, the semiconductor device 100 may comprise a resist mask 103 exposing the second device region 120, while covering the first device region 110. In this case, it may be assumed that the intrinsic stress of the silicon nitride layer 130 may be appropriately selected so as to enhance the transistor performance in the first device region 110.

A typical process flow for forming the semiconductor device 100 as shown in FIG. 1a may comprise the following processes. The gate electrodes 121, 111 and the gate insulation layers 123, 113 may be formed and patterned on the basis of well-established process techniques including advanced photolithography, deposition, oxidation and etch techniques. Thereafter, the drain and source regions 125, 115 may be formed in combination with the sidewall spacer structures 122, 112 on the basis of well-established deposition, anisotropic etch processes and implantation sequences in order to establish the desired vertical and lateral dopant profile. Thereafter, respective silicide regions (not shown) may be formed, if required, on the basis of well-established techniques. Thereafter, if required, a corresponding silicon dioxide etch stop layer (not shown) may be formed followed by the deposition of the silicon nitride layer 130. During the deposition of the silicon nitride material, respective process parameters, such as composition of carrier gases and reactive gases, substrate temperature, deposition pressure and, in particular, ion bombardment during the deposition, may significantly influence the finally obtained intrinsic stress of the material as deposited with respect to the underlying materials. Thus, by selecting appropriate parameter values, a high degree of intrinsic stress, such as up to 2 Giga Pascal (GPa) and even more of compressive stress or up to 1 GPa or even significantly higher of tensile stress, may be created so as to enhance the performance of the transistor in the first device region 110. Due to the less pronounced conformality of the silicon nitride deposition process and due to the reduced distance between the neighboring transistor elements in densely packed device areas, such as the second device region 120, the silicon nitride material may merge in the lateral growth direction between closely spaced transistor elements, thereby forming the respective seam 131. Thus, in the subsequent deposition of the silicon dioxide layer 132, the local deposition conditions at the seam 131 may result in a non-uniformity of the layer thickness, thereby creating a locally, significantly enhanced silicon dioxide thickness, which may even amount to a thickness of up to three to four times the thickness of the silicon dioxide layer 132 at areas distant from the seam 131.

After the deposition of the silicon dioxide layer 132, the resist mask 103 may be formed on the basis of well-established photolithography techniques. Next, an appropriately designed etch process may be performed in order to remove a portion of the layers 130 and 132 from the second device region 120. During the corresponding etch process, the silicon dioxide material of the layer 132 may be removed first, followed by a selective etch process for removing the material of the silicon nitride layer 130, wherein the corresponding etch process may be controlled on the basis of an etch stop layer, if required. Due to the significantly increased layer thickness of the silicon dioxide layer 132 at the seam 131, the material may not be completely removed during the etch process when removing the layer 132, thereby significantly blocking the selective etch chemistry during the subsequent etch process for removing the exposed portion of the silicon nitride layer 130.

FIG. 1b schematically illustrates the semiconductor device 100 after the corresponding etch process. Hence, after removal of the resist mask 103, the silicon nitride layer 130 may be formed above the first device region 110 including the silicon dioxide layer 132, while the corresponding transistor elements in the second device regions 120 are substantially exposed, except for respective material residues 133 caused by respective non-uniformities of the preceding etch process at the seam 131, as previously explained. During the further processing, i.e., the deposition of a silicon nitride layer having a different intrinsic stress above the first and second device areas 110, 120 and removing the corresponding silicon nitride layer from the first device region 110 by an etch process controlled on the basis of the etch indicator layer 132, the residues 133 may result in significant process non-uniformities, creating respective material residues when forming a contact opening at the seam 131, which may finally result in a reduced transistor performance or even a contact failure. Consequently, in sophisticated applications, the conventional process sequence for providing silicon nitride layers of different intrinsic stress may no longer be appropriate, in particular when transistor dimensions are further scaled down.

FIG. 1c schematically illustrates the semiconductor device 100 in an advanced manufacturing stage in order to demonstrate further issues associated with the conventional process sequence for forming silicon nitride layers of different intrinsic stress. In this manufacturing stage, the device region 110 may comprise a silicon nitride layer 130 and the silicon dioxide layer 132, while the transistors of the second device region 120 have formed thereabove a second silicon nitride layer 140 having a different type of intrinsic stress. Moreover, an interlayer dielectric material, such as a silicon dioxide material 150, may be provided followed by a respective resist mask 106 in order to define respective openings for forming a contact opening 151 in the interlayer dielectric material 150. The second silicon nitride layer 140 may be formed on the basis of an appropriately controlled deposition process, as previously described, followed by an etch process for removing the layer 140 from above the first device region 110, controlled by the etch indicator layer 132 in order to identify the end of the corresponding etch process. That is, during etching of the non-covered material of the layer 140 above the first device region 110, the etch front may finally reach the etch indicator layer 132, thereby releasing a certain degree of byproducts into the etch ambient, which may be efficiently detected by optical endpoint detection systems. Consequently, the corresponding etch process may be controlled on the basis of this endpoint detection signal in order to substantially completely remove the unwanted material of the layer 140, while not unduly removing any material of the silicon nitride layer 130.

Thereafter, the interlayer dielectric material 150 may be formed on the basis of well-established techniques followed by forming the resist mask 106. Next, an anisotropic etch process may be performed in which the layers 130, 140 may efficiently act as etch stop layers. In a subsequent etch process on the basis of a different etch chemistry, the layers 130 and 140 may be opened so as to provide an opening extending to the respective contact areas of the transistor elements. However, at areas in which an overlap of the two silicon nitride layers 130, 140 may occur, indicated as 152, the corresponding silicon dioxide layer 132 may not be efficiently removed during the etch step for etching through the material of the layer 150 in order to form a respective contact opening therein, such as the opening 151. Consequently, during the subsequent etch process for opening the silicon nitride material, the corresponding etch process encounters a layer stack comprised of nitride and oxide, which may result in a significantly different etch behavior compared to other areas in which a single nitride layer has to be opened. Consequently, the corresponding last process step for opening the nitride material may have a significantly increased complexity, thereby resulting in significant etch damage in areas having a single nitride layer or resulting in non-removed dielectric materials at the area 152. As a result, the conventional process strategy for forming silicon nitride layers of different intrinsic stress may yield respective non-uniformities, such as material residues 133 and/or contact non-uniformities caused by the complex layer stack at overlap regions 152, thereby also causing respective non-uniformities of the transistor performance.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, embodiments disclosed herein are directed to process techniques for forming stressed dielectric layers above respective transistor elements, wherein deleterious effects of a conventional silicon dioxide based etch indictor layer that is conventionally provided between differently stressed dielectric layers may be reduced by providing an enhanced control strategy of a respective etch process formed on the basis of efficient optical measurement data, thereby providing the potential for completely avoiding the formation of a respective etch indicator material. In other aspects, an efficient endpoint detection is provided by using highly efficient etch indicator materials resulting in an efficient endpoint detection signal while substantially not affecting the further processing due to a significantly reduced concentration and/or layer thickness of the corresponding dedicated etch indictor material compared to conventional silicon dioxide based materials. In other illustrative aspects, an appropriate indicator species may be incorporated into one of the stress-inducing layers, substantially without compromising the stress characteristics thereof so as to provide a pronounced difference of the resulting endpoint detection signals.

One illustrative method disclosed herein comprises forming a first stress-inducing layer above a first transistor and a second transistor, wherein the first and the second transistors are formed above a first substrate. Furthermore, a portion of the first stress-inducing layer located above the second transistor is removed and a second stress-inducing layer is formed on the first stress-inducing layer. Thereafter, a portion of the second stress-inducing layer is removed from above the first transistor on the basis of an etch process using a specified parameter setting. At least one parameter of the etch process is controlled on the basis of optical measurement data indicating an etch rate of the etch process.

Another illustrative method disclosed herein comprises forming a first stress-inducing layer above a first transistor and a second transistor, which are formed above a substrate. A portion of the first stress-inducing layer located above the second transistor is removed and a second stress-inducing layer is formed on the first stress-inducing layer, wherein the first and second stress-inducing layers differ in at least one type of atomic species incorporated therein. Finally, a portion of the second stress-inducing layer is removed from above the first transistor on the basis of an etch process that is controlled on the basis of an optical signal obtained from the at least one type of differing atomic species.

Yet another illustrative method disclosed herein comprises providing a first stress-inducing layer above a substrate, wherein the first stress-inducing layer covers a first transistor and exposes a second transistor. An etch indicator layer is provided on the first stress-inducing layer with a thickness of approximately 5 nm or less. Furthermore, a second stress-inducing layer is formed on the etch indicator layer and above the second transistor. Finally, the second stress-inducing layer is removed from above the first stress-inducing layer by an etch process controlled on the basis of a signal generated by the etch indicator layer.

BRIEF DESCRIPTION OF THE DRAWINGS

The disclosure may be understood by reference to the following description taken in conjunction with the accompanying drawings, in which like reference numerals identify like elements, and in which:

FIGS. 3b-3c schematically illustrate respective process flows and control strategies for patterning the different stress-inducing layers of the embodiments of FIG. 3a;

Figure 1A:
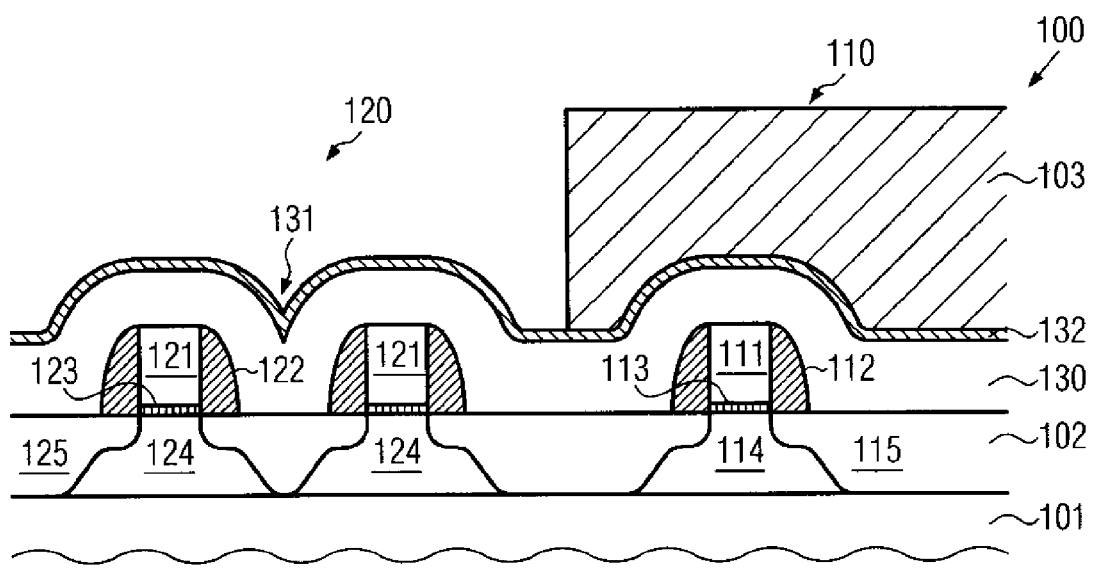
FIGS. 1a-1c schematically illustrate cross-sectional views of a conventional semiconductor device during various manufacturing stages in forming silicon nitride layers of different intrinsic stress on the basis of an intermediate silicon dioxide layer, resulting in process non-uniformities in highly scaled semiconductor devices.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein relates to an enhanced process flow for forming stress-inducing layers above respective transistor elements by avoiding or reducing the amount of a silicon dioxide based etch indicator material between the first and the second stress-inducing layers, as is previously explained with reference to the device 100. Consequently, the corresponding surface topography caused by the overall dimensions of the semiconductor device under consideration and the gap-fill capabilities of the respective deposition process for forming the highly stress dielectric material may have a significantly reduced influence on the further processing, such as the etch process for removing unwanted layer portions of the stressed dielectric material and/or the formation of respective contact openings in a subsequent manufacturing stage. In some aspects of the subject matter disclosed herein, this may be accomplished by completely omitting any etch indicator layer and performing the corresponding etch process on the basis of an enhanced control regime using respective optical measurement data indicating the momentary etch rate and/or the etch rate encountered by previously processed substrates. In some aspects, additionally, pre-etch measurement data may be used so as to also provide information about the initial layer thickness prior to performing the respective etch process. On the basis of the respective optical measurement data, process variations with respect to etch process fluctuations and, if pre-etch measurement data are used, with respect to thickness fluctuations may be highly efficiently compensated for, thereby providing the potential for reliably and substantially completely removing unwanted dielectric material without significantly affecting the lower lying dielectric material of a different type of intrinsic stress. In some aspects, the respective optical measurement data may be obtained on the basis of efficient metrology techniques, such as scatterometry performed on the basis of appropriately designed measurement structures such as periodic patterns. In other aspects, efficient optical measurement techniques may be provided for an in situ monitoring of the decrease in layer thickness, thereby providing information on the momentary etch rate so that a fast responsiveness during the control of the etch process with respect to etch rate non-uniformities may be obtained. Consequently, due to the omission of the deposition process for a conventional silicon dioxide based etch indicator material, the overall throughput of the respective process sequence may be enhanced due to the reduced number of process steps, since the corresponding measurements and control activities may not substantially contribute to additional cycle of time. For instance, performing a corresponding in-line layer thickness control may be comparable to performing a conventional endpoint detection in terms of equipment and computational resources, while in the case of post-etch optical measurement data, respective measurement processes for estimating the process results with respective appropriate measurement techniques may also have to be performed in conventional strategies.

In some other aspects of the present disclosure, the controllability of the respective etch process may, additionally or alternatively to the concepts described above, be maintained or enhanced compared to conventional strategies while, however, a significantly reduced amount of appropriate etch indicator material may be used. In some aspects, an appropriate species may be substantially homogenously incorporated into one of the two dielectric layers of different intrinsic stress in order to provide a significant difference for creating an optical response during the etch process. In other illustrative embodiments, an appropriate species may be provided in or on the first stress-inducing layer on the basis of any appropriate technique, such as surface treatments, deposition and the like, wherein the type of material may be selected so as to substantially not unduly affect the further processing while nevertheless providing a prominent endpoint detection signal. For example, appropriate implantation or plasma treatment techniques may be used in order to modify the respective surface areas so as to incorporate the respective indicator species, wherein even very "exotic" species may be used in order to obtain an efficiently detectable endpoint detection signal, while requiring only low concentrations. On the other hand, respective material layers of reduced thickness may be deposited which may include respective exotic materials at low concentration, thereby also reducing any negative influence on the characteristics of the further process flow. Hence, the corresponding processes such as implantation, plasma treatment and deposition with moderately low layer thickness, such as approximately 5 nm and even significantly less, may have a significantly different behavior compared to the deposition scenario for forming the silicon dioxide based etch stop layer in the conventional strategy. Hence, any pronounced negative impact caused by the respective surface topography of the transistors may not substantially affect the process uniformity in the subsequent manufacturing processes.

Consequently, even for highly scaled semiconductor devices of the 65 nm technology node and beyond, an efficient strain-inducing mechanism may be established on the basis of respective stress-inducing overlayers while avoiding or at least reducing any non-uniformities caused by the presence of a deposited silicon dioxide layer.

Figure 2A:
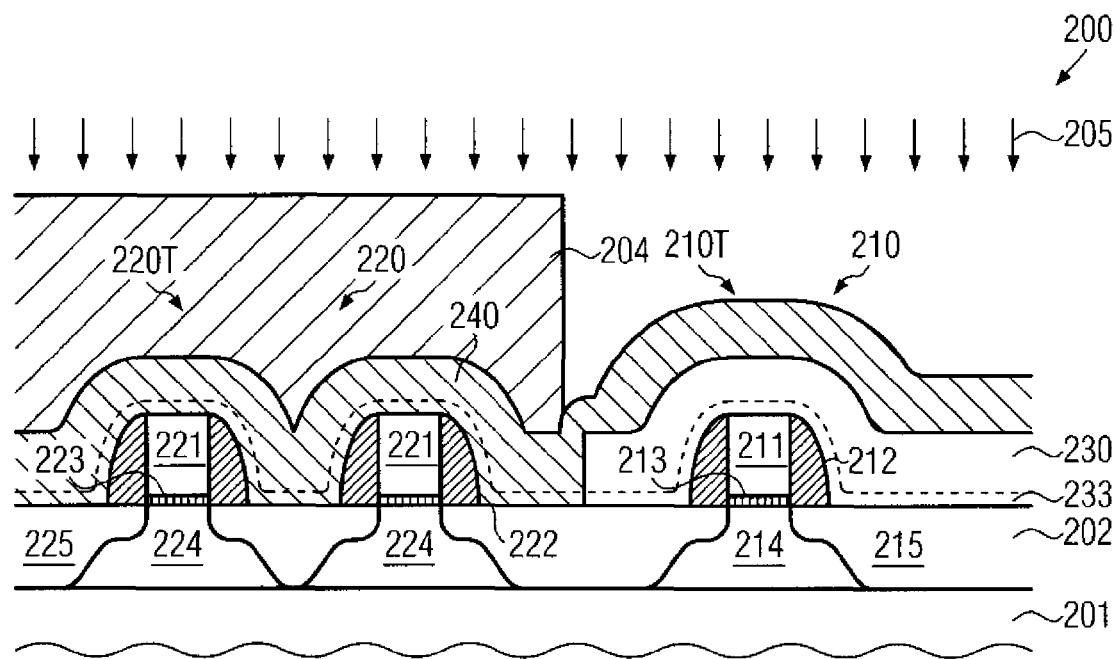
FIGS. 2a-2b schematically illustrate cross-sectional views of a semiconductor device during various manufacturing stages for forming stress-inducing layers of different intrinsic stress without depositing an intermediate etch indicator layer, according to illustrative embodiments disclosed herein.

FIG. 2a schematically illustrates a cross-sectional view of a semiconductor device 200 comprising a first device region 210 and a second device region 220 that are formed above a substrate 201 having formed thereon a semiconductor layer 202. The substrate 201 may represent any appropriate carrier material, such as a semiconductor bulk substrate, for instance on the basis of silicon, or an insulating material having formed thereon the substantially crystalline semiconductor layer 202. For example, the layer 202 and the substrate 201 may constitute an SOI configuration on the basis of a corresponding buried insulating layer (not shown). The first and second device regions 210, 220 may comprise one or more respective transistor elements 210T, 220T, respectively. For example, in the first device region 210, the corresponding transistor 210T may comprise a gate electrode 211 formed on a gate insulation layer 213 separating the gate electrode 211 from a corresponding channel region 214. Respective drain and source regions 215 may be formed on the basis of an appropriate dopant profile within the layer 202. Furthermore, a respective sidewall spacer structure 212 may be formed on sidewalls of the gate electrode 211. Similarly, the one or more transistors 220T in the second device region 220 may comprise a gate electrode 221, a gate insulation layer 223, a channel region 224, drain and source regions 225 and a sidewall spacer structure 222. Furthermore, respective feature sizes may include minimal dimensions of 50 nm and significantly less, as is previously explained with reference to the semiconductor device 100. For instance, the portion of the second device region 220 illustrated may represent a densely packed area with reduced lateral distances between neighboring transistors, as is previously explained. It should be appreciated that respective dense areas may also exist in the first device region 210. Furthermore, in this manufacturing stage, the semiconductor device 200 may comprise a first stress-inducing layer 230, which may be comprised of any appropriate dielectric material that enables the creation of a respective high intrinsic stress. In one illustrative embodiment, the first stress-inducing layer 230 may be comprised of silicon nitride in any appropriate configuration so as to exhibit the desired high degree of intrinsic stress in the first device region 210, that is, above a first transistor 210T provided therein. Furthermore, a second stress-inducing layer 240 is formed on the first layer 230 and above the one or more second transistors 220T, i.e., above the second device region 220. The second stress-inducing layer 240 may be comprised of any appropriate material, such as silicon nitride and the like, wherein, in some illustrative embodiments, the material composition of the first and second layers 230, 240 may be similar with respect to atomic species, however, the density, the amount of hydrogen and the like may vary so as to provide different types of intrinsic stress.

In one illustrative embodiment, an optional etch stop layer 233, indicated in dashed lines, may be formed below the first and/or the second stress-inducing layers 230, 240 while, in other embodiments, the corresponding etch stop layer 233 may be omitted. Furthermore, in this manufacturing stage, an etch mask 204, such as a resist mask, may be provided in order to expose the first device region 210 and cover the second device region 220.

Figure 1B:
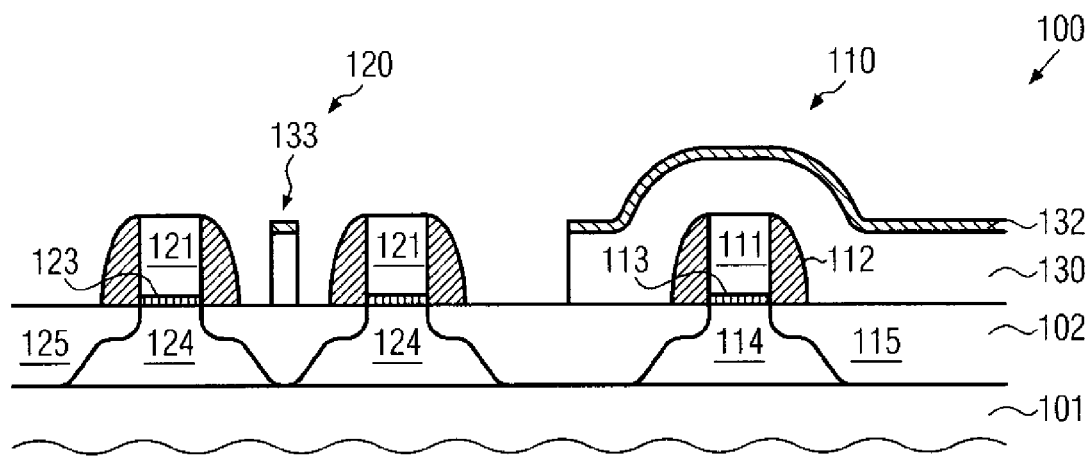
Figure 1C:
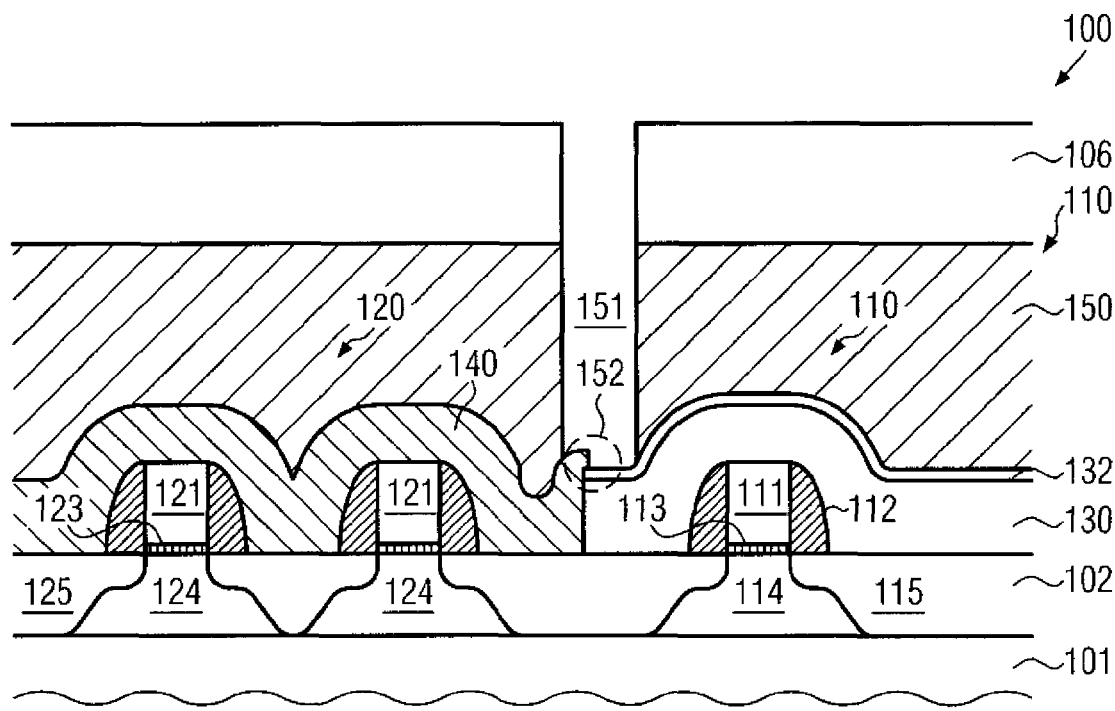

A typical process for forming the semiconductor device 200 as shown in FIG. 2a may comprise similar manufacturing techniques as are previously described with reference to device 100 except for the omission of the deposition of an etch indicator layer, such as the silicon dioxide layer 132, as shown in FIGS. 1a-1c. Thus, the transistor devices 210T, 220T in the first and second device regions 210, 220, respectively, may be formed on the basis of well-established techniques, which may also include respective silicidation process regimes, wherein, for convenience, any such metal silicide regions are not shown in FIG. 2a. After completing the basic transistor configuration, the optional etch stop layer 233 may be formed, for instance as a silicon dioxide layer having a sufficient thickness for reliably stopping a subsequent etch process for patterning the first stress-inducing layer 230. In other cases, the layer 233 may be omitted or may be formed so as to provide an efficient endpoint detection signal while not requiring completely stopping the corresponding etch process. In still other illustrative embodiments, the etch stop layer 233 may be patterned so as to expose the first device region 210 prior to the deposition of the layer 230 in order to enhance the stress transfer mechanism from the first dielectric layer 230 into the respective channel region 214. Next, the layer 230 may be deposited on the basis of appropriate deposition techniques, controlled by appropriate process parameters in order to obtain a specified intrinsic stress and an appropriate layer thickness. Thereafter, the layer 230 may be patterned on the basis of a corresponding etch process, as previously described with reference to FIG. 1a, wherein a corresponding etch process may be performed with reduced complexity due to the missing silicon dioxide layer 132 (FIG. 1a). The corresponding etch process may be controlled on the basis of the layer 233, if provided, or may use the selectivity to the respective metal silicide regions, if provided. In other cases, the etch process may be stopped or controlled on the basis of the layer 233 and thereafter the layer 233 may be removed, if required. Consequently, contrary to the conventional strategy as shown in FIG. 1b, any material residues, such as the residues 133, may be substantially reduced or avoided irrespective of the complex surface topography created by the deposition process for forming the first layer 230.

Next, the second layer 240 may be deposited on the basis of any appropriate technique, for instance plasma enhanced chemical vapor deposition (PECVD) if, for instance, silicon nitride is used. Thus, in the illustrative embodiment shown, the layers 230 and 240 may contain substantially the same atomic species, however, with a varying composition and molecular structure so as to provide the different types of intrinsic stress. However, in a corresponding etch process on the basis of the etch mask 204, which may be formed for instance by well-established photolithography techniques, a pronounced endpoint detection signal may not be observed due to the similarity of the respective volatile byproducts created during the etch process, when the etch front advances, during removal of the layer 240, to the layer 230. In this case, an etch process 205 may be used which may be controlled on the basis of optical measurement data indicating the etch behavior, i.e., the removal rate, in order to substantially completely remove the exposed portions of the layer 240, while not unduly removing material of the layer 230. The optical measurement data used during the etch process 205 may be obtained on the basis of metrology techniques, such as interferometry, scatterometry and the like, as will be described later on in more detail with reference to FIGS. 2c-2g, in order to account for process variations in forming the layer 240 and/or etch rate variations of the process 205 which may exist between several substrates processed in the same or different process chambers. Consequently, after having adjusted at least one process parameter, such as the etch time of the process 205, based on the optical measurement data, the layer 240 may be substantially completely removed from above the first device region 210.

Figure 2B:
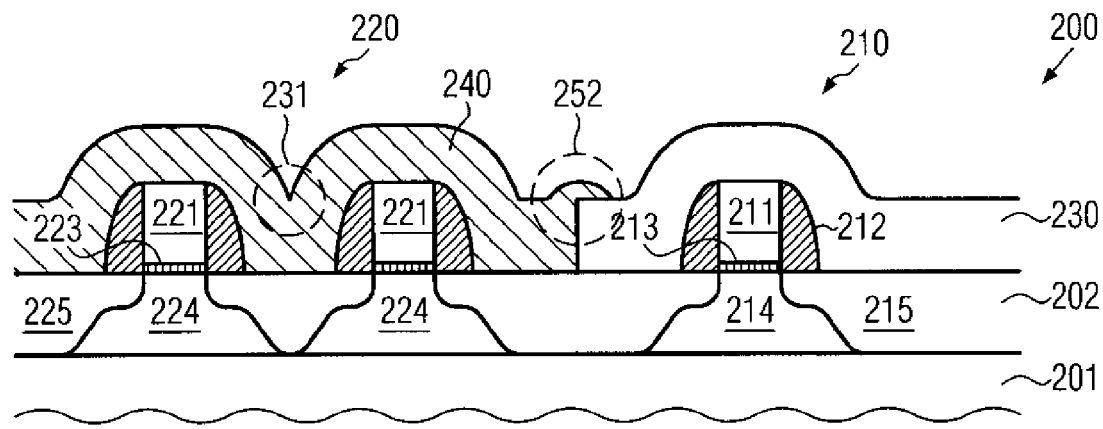

FIG. 2b schematically illustrates the semiconductor device 200 after the etch process 205 and the removal of the etch mask 204. Consequently, a high degree of homogeneity in the material composition may be accomplished in the semiconductor device 200 with respect to the layers 230 and 240, even at critical locations such as an area 231 corresponding to the seam created during the deposition of the first and second layers 230, 240, and also an area 252 corresponding to an overlay region of the first and second layers 230, 240, which may now be comprised of substantially the same materials, since any intermediate etch indicator layer portion may not be present.

Thus, the further processing, i.e., the deposition of an interlayer dielectric material and the subsequent patterning of the interlayer dielectric material and the first and second layers 230, 240, may be performed on the basis of well-established etch regimes with enhanced uniformity, thereby providing the potential for further scaling the feature sizes on the basis of well-established process techniques.

With reference to FIGS. 2c-2g, illustrative embodiments will now be described in which appropriate optical measurement data for the etch process 205 may be obtained on the basis of scatterometry measurement techniques, wherein the measurement data may then be used as appropriate feedback data in an appropriate control technique.

Figure 2C:
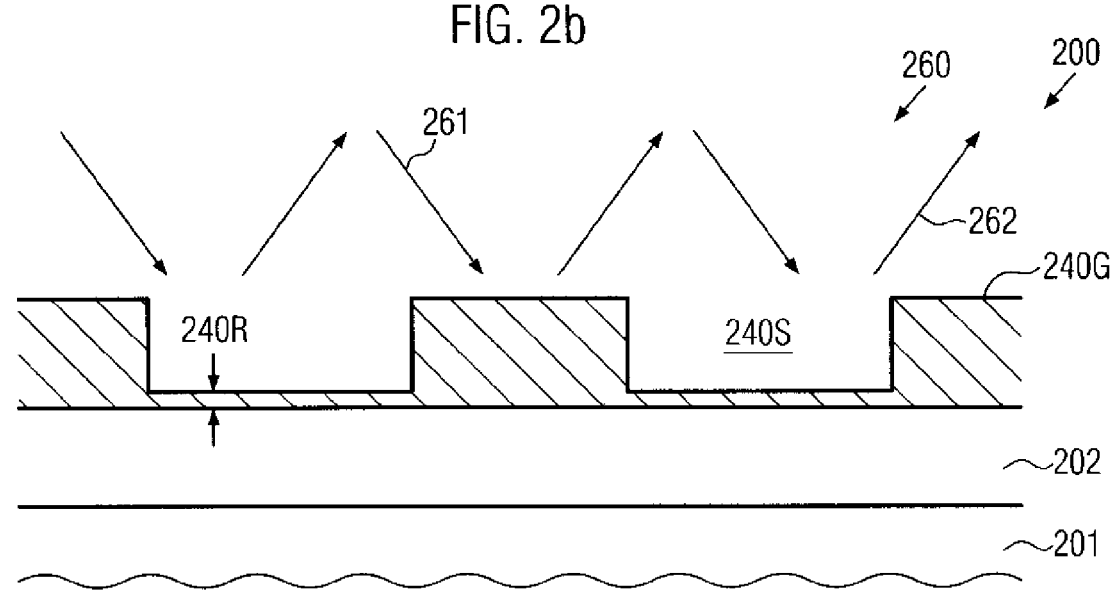
FIGS. 2c-2f schematically illustrate a respective test structure located on a respective measurement site for obtaining optical measurement feedback data by scatterometry, according to illustrative embodiments disclosed herein.

FIG. 2c schematically illustrates a measurement site 260, which may be located at any appropriate position in the semiconductor device 200 so as to allow accessing of the measurement site 260, for instance, by an incident optical beam 261, receiving a scattered beam 262 by a measurement device, wherein the beam 262 may contain information on the geometrical configuration of the measurement site 260. In the embodiment shown, the measurement site 260 may comprise a grating-like measurement structure including a plurality of line-like features 240G with respective spaces 240S, thereby providing a respective grating. For instance, the measurement site 260 may have dimensions appropriate for automatically identifying the measurement site 260 and directing the beam 261 thereon by well-known devices, such as lasers and the like, in order to obtain the scattered beam 262 substantially without any interfering "noise components," which may result from portions outside the measurement site 260. For instance, the measurement site 260 may be provided with lateral dimensions of several tens of micrometers, such as approximately 50 mm times 50 mm and the like. Furthermore, the lines 240G and spaces 240S may be designed in an appropriate size with respect to a specific wavelength range in order to obtain a desired response for determining at least one specific characteristic of the lines and spaces 240G, 240S. For instance, the respective depth of the spaces 240S may be determined on the basis of the scattered beam 262 on the basis of appropriate scatterometry techniques, that is, by comparing the optical response contained in the beam 262 with appropriately selected reference data, which may be obtained on the basis of simulation and the like. For example, in the embodiment shown, the grating defined by the lines 240G and spaces 240S may be formed on the basis of the second stress-inducing layer 240, while the layer 230 may remain substantially non-patterned or may be substantially completely removed from the measurement site 260 depending on process requirements. Thus, the grating 240G, 240S may be designed in a highly efficient manner with respect to an optical response, for instance, for estimating the respective trench depth, which may represent an indication of the etch rate encountered during the formation of the spaces 240S from the initially deposited second stress-inducing layer 240.

In the example shown, during the etch process 205 (FIG. 2a), an appropriate resist mask may be provided above the measurement site 260 so as to define the basic structure of the lines and spaces 240G, 240S. During the respective etch process 205, exposed portions of the layer 240 in the measurement site 260 may be etched on the basis of substantially the same etch conditions as are also encountered in the device region 210 so that, for instance, the respective depth of the spaces 240S may represent an indication of the respective etch rate for a given etch time of the process 205. In FIG. 2c, it may be assumed that the corresponding etch process 205 may have resulted in a respective residual layer 240R, the thickness of which determines the resulting depth of the spaces 240S. The corresponding information on the resulting depth of the spaces 240S may be encoded into the scattered beam 262 and may therefore be used as an indication, in combination with the initial layer thickness, for the etch rate of the process 205. This information may then be appropriately used as feedback information for a subsequent etch process in order to appropriately control at least one process parameter of the etch process 205 so as to obtain the essentially complete removal of the layer 240 above the device region 210, while not unduly removing any underlying materials.

Figure 2D:
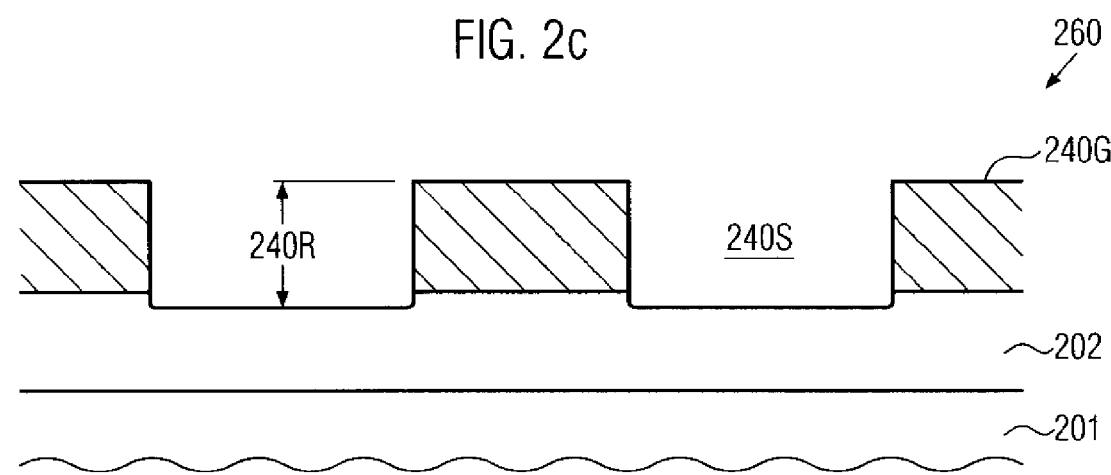

FIG. 2d schematically illustrates the measurement site 260, wherein it may be assumed that the corresponding etch process 205 may have resulted in a complete removal of exposed portions of the layer 240 within the spaces 240S or may even have removed material of the underlying layer 230, if provided in the measurement site 260. Thus, a respective information of an increased depth of the spaces 240S may be encoded into the scattered beam 262 and may therefore be evaluated on the basis of the initial layer thickness so as to indicate the corresponding etch rate of the process 205, wherein FIG. 2d may represent an increased etch rate, when substantially the same etch time has been used for obtaining the configuration of the measurement site 260 shown in FIGS. 2c and 2d.

Figure 2E:
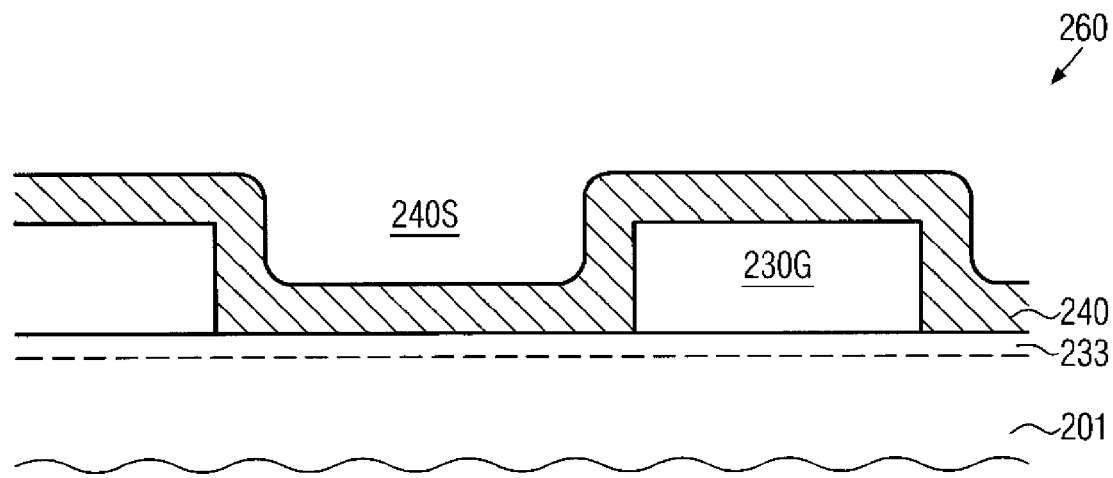

FIG. 2e schematically illustrates the measurement site 260 according to further illustrative embodiments, in which the first stress-inducing layer 230 may be patterned during a corresponding etch process for removing the first layer 230 from the second device region 220 (FIG. 2a) in order to provide respective lines 230G and respective spaces which may be subsequently filled with material of the layer 240. Due to the initially provided surface topography, the layer 240 may form the respective spaces 240S between the respective lines 230G.

Figure 2F:
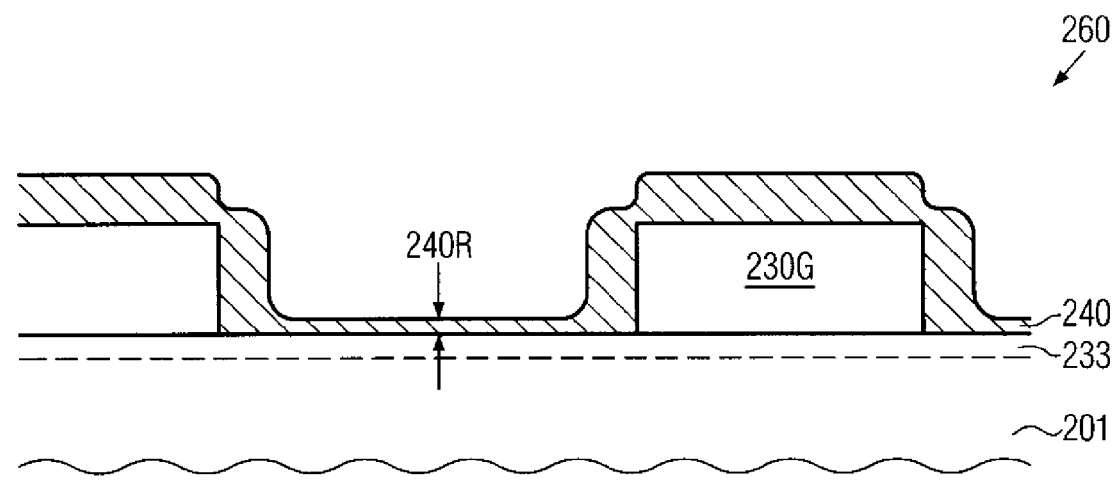

FIG. 2f schematically illustrates the measurement site 260 in an advanced manufacturing stage, i.e., after the etch process 205 for substantially removing material of the layer 240 from the first device region 210, thereby also reducing the thickness of the layer 240 formed in the spaces 240S, while the material above the lines 230G may be covered by the etch mask. Depending on process conditions during the process 205, the corresponding etch rate, in combination with the respective etch time used, a more or less complete removal of the material of the layer 240 may be obtained in the first device region 210 and also in the measurement site 260 in the spaces 240S. For example, when an incomplete removal may be caused by the corresponding process conditions, a residual layer 240R may be provided within the spacing 240S, thereby influencing the overall characteristics of the spacing 240S, such as the depth thereof. Consequently, during the respective optical measurement process and based on an appropriate model of measurement site 260, the corresponding information with respect to the etch rate may be obtained as described above. It should be appreciated that the patterning process for creating the lines 230G and the respective spaces from the first stress-inducing layer 230 may be substantially independent from the corresponding etch process for patterning the first stress-inducing layer 230 due to a respective high etch selectivity between the layer 230 and any underlying material, for instance, the etch stop layer 233. Hence, a respective influence of the etch characteristics of the process for patterning the layer 230 on the finally obtained characteristics of the spacing 240S obtained during the second etch process 205 may be eliminated and respective variations in the respective deposition processes may be determined on the basis of respective thickness measurements for the first and second stress-inducing layers 230, 240. Thus, in this case, an efficient measurement structure may be provided by patterning both of the layers 230, 240, wherein respective process characteristics of the etch process 205 may be determined on the basis of the scatterometry techniques as previously described. If, for instance, the corresponding etch process may exhibit an etch rate, resulting in excessive material removal, the residual layer 240R in the spacing 240S may be completely removed, wherein the corresponding etch process may then reliably stop on the etch stop layer 233, while material at the sidewalls of the lines 230G may then be increasingly removed, thereby also changing the finally obtained characteristics of the spacing 240S. Thus, in this case, the measurement site 260 may be sensitive to increased and reduced etch rates of the process 205, while nevertheless highly efficient scatterometry models, i.e., reference data may be established due to relatively simple structure of lines and spaces.

In some illustrative embodiments, the measurement site 260 may also be used for determining thickness values for the layers 230 and/or 240 based on scatterometry measurement techniques. For instance, in the configuration as shown in FIG. 2e, an appropriate model, i.e., reference data, may be created for the structure defined by the lines 230G and the respective spaces prior to depositing the second stress-inducing layer 240. In this case, the corresponding depth of the spacings between the lines 230G indicates the initial layer thickness, since the depth of the respective spacings is substantially independent from any variations of the etch process, since the etch process may typically be performed so as to completely substantially remove any material based on the etch stop layer 233 or any other material layer having a significantly different etch rate compared to the material of the layer 230. The thickness of the layer 230 may be determined and may be used for process monitoring, controlling and the like. Similarly, an appropriate model may be established for the measurement site 260 after the deposition of the second stress-inducing layer 240 in order to also determine the initial layer thickness prior to performing the etch process 205. Depending on the process strategy, respective measurements data indicating the layer thickness of the layer 230 may be used in determining the thickness of the layer 240. Consequently, the same measurement equipment and process techniques may be used for determining initial layer thicknesses of the layer 240 and the corresponding material removal during the process 205 as previously explained, thereby obtaining a measure of the corresponding etch rate established during the etch process 205.

In other cases, the initial layer thickness of at least the second stress-inducing layer 240 may be determined on the basis of other measurement techniques, such as ellipsometry and the like.

Figure 2G:
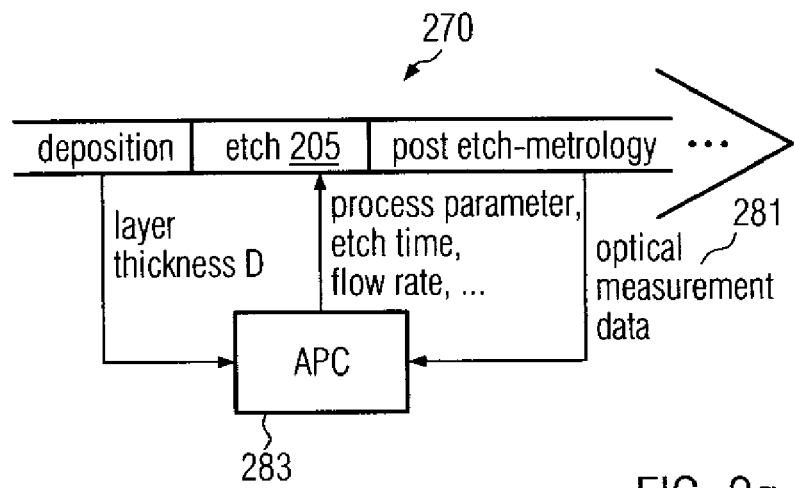
FIG. 2g schematically illustrates a process flow and a control strategy for implementing a controlled etch process on the basis of efficient optical measurement data, according to illustrative embodiments disclosed herein.

FIG. 2g schematically shows an illustrative process flow for forming the semiconductor device 200 on the basis of an appropriate control strategy, which, in one illustrative embodiment, comprises a model-based control technique, which may also be referred to as an advanced process control (APC) strategy. The process flow, indicated as 270, may include the process sequence as previously described for the device 200, wherein, for convenience, the deposition process for forming the second stress-inducing layer 240 is illustrated as the first process. The deposition process may include the subsequent determination of the layer thickness, for instance, on the basis of the measurement site 260, as previously described, or on the basis of any other appropriate layer thickness measurement process. The respective measurement data may be supplied to a controller 280 which, in one illustrative embodiment, may have implemented therein a model-based algorithm in order to establish an appropriate process parameter value, that is, an appropriate value for an etch-related parameter, such as the etch time, flow rates of gases and the like, of the etch process 205, on the basis of the layer thickness data obtained. The controller 280 may further receive optical measurement data 281, for instance, in the form of respective geometric data obtained by scatterometry, as previously described with reference to FIGS. 2c-2f, wherein this optical measurement data has an indication included therein with respect to the status of the respective etch ambient used in the etch process 205 when performed on a previously processed substrate. Thus, by assessing the etch rate, i.e., the optical measurement data indicating, for instance, a depth of the respective spacing 240S and the initial layer thickness, the controller 280 may provide a target value for the etch process 205 of a semiconductor device 200 to be processed subsequently, wherein the respective value of the process parameter under consideration may therefore be adapted to the current or predicted momentary status of the etch process 205, thereby substantially compensating for process fluctuations which may have occurred during the deposition of the layer 240 to be processed, and during the etch process 205 for a previously processed substrate.

For example, the controller 280 may have implemented therein a linear model of the etch process, wherein a thickness of removed material may depend on the etch time and the etch rate and wherein a target value for the thickness of the removed material may be defined by the initial layer thickness of the second stress-inducing layer 240. Moreover, based on the optical measurement data 281, an updated value for at least one process parameter may be determined so as to re-establish the etch ambient in a way that the layer 240 may be substantially completely removed while avoiding any excessive material removal of the underlying layer 230. For instance, the controller 280 may determine an appropriate etch time and/or any other appropriate parameter value, such as a modified flow rate for reactive gas components, carrier gas components and the like, so as to obtain the desired process result. Due to the respective model implemented in the controller 280, an appropriate adaptation of the etch process 205 may be obtained even if a certain delay exists before the corresponding optical measurement data 281 is available, while also a moderate degree of coverage of the measurement data 281 with respect to the number of processed substrates may be sufficient due to the predictive behavior of the controller 280. Consequently, the new target value for the respective process parameter, such as the etch time, may be established so as to obtain a substantially complete removal of exposed portions of the material 240 without requiring additional etch control mechanisms, such as an etch indicator material and the like. It should be appreciated that, for enhanced controller stability, respective measures may be taken, such as using a moving average, such as an exponential weighted moving average (EWMA), for appropriately weighting the etch rate used in the model of the controller 280. However, any other appropriate control regimes may be used in other illustrative embodiments.

Figure 2H:
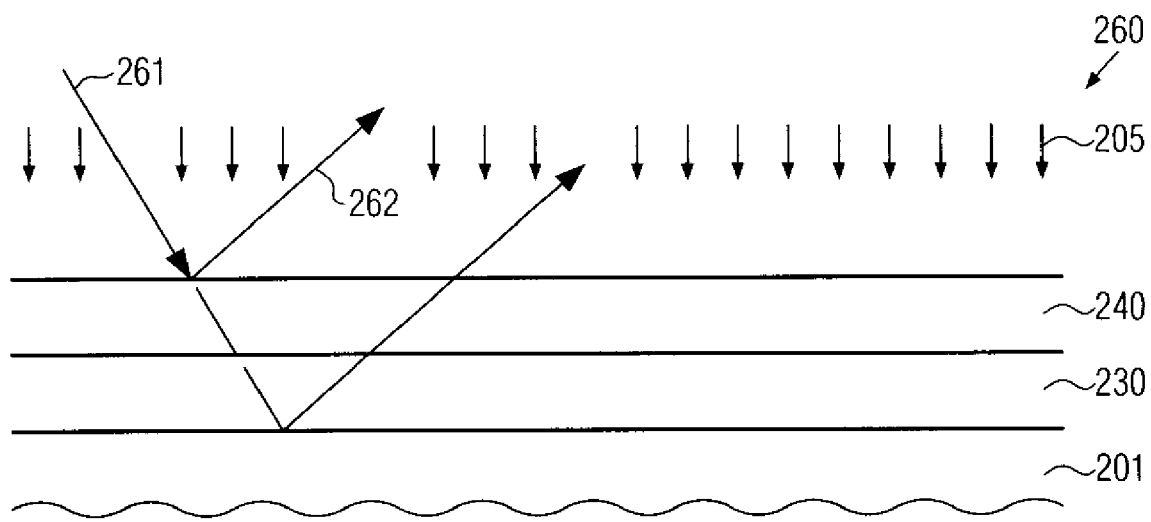
FIG. 2h schematically illustrates a measurement site during a respective etch process for removing unwanted portions of a stressed dielectric layer on the basis of in-line optical measurement techniques for monitoring the momentary layer thickness, according to other illustrative embodiments disclosed herein.
Figure 2I:
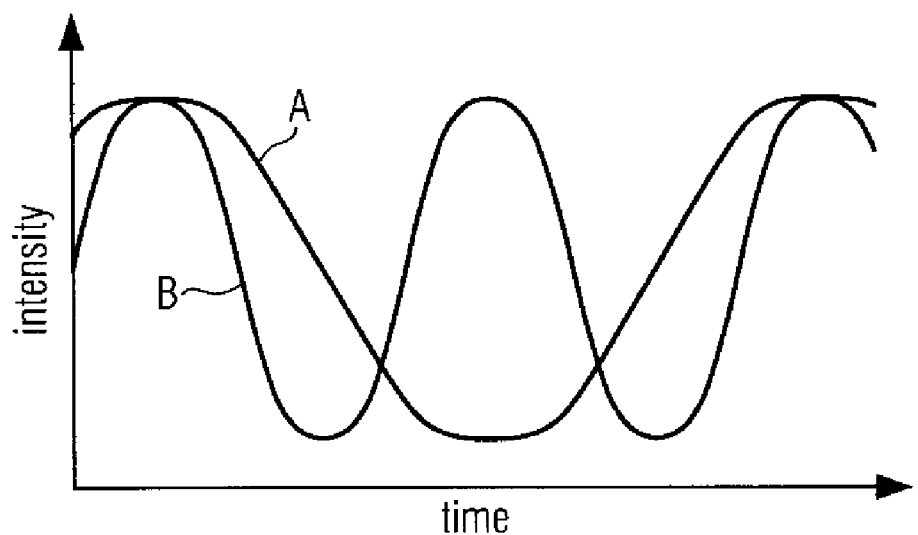
FIG. 2i schematically illustrates results of interferometric measurements during an etch process for two different etch rates.
Figure 2J:
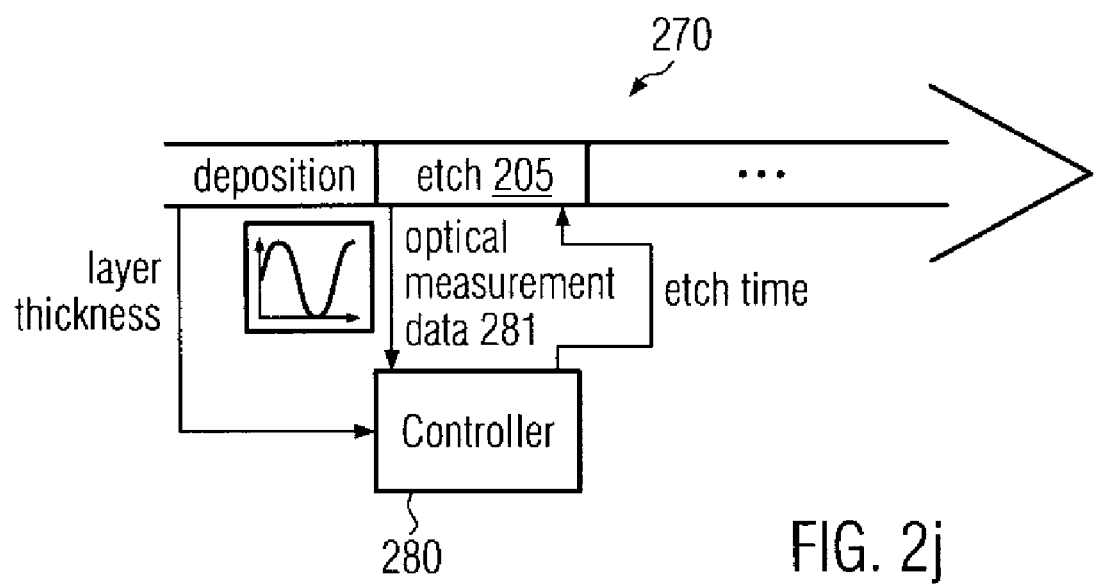
FIGS. 2j-2k schematically illustrate respective process flows and control strategies using optical measurement data obtained by the measurement site shown in FIG. 2h, according to illustrative embodiments disclosed herein.
Figure 2K:
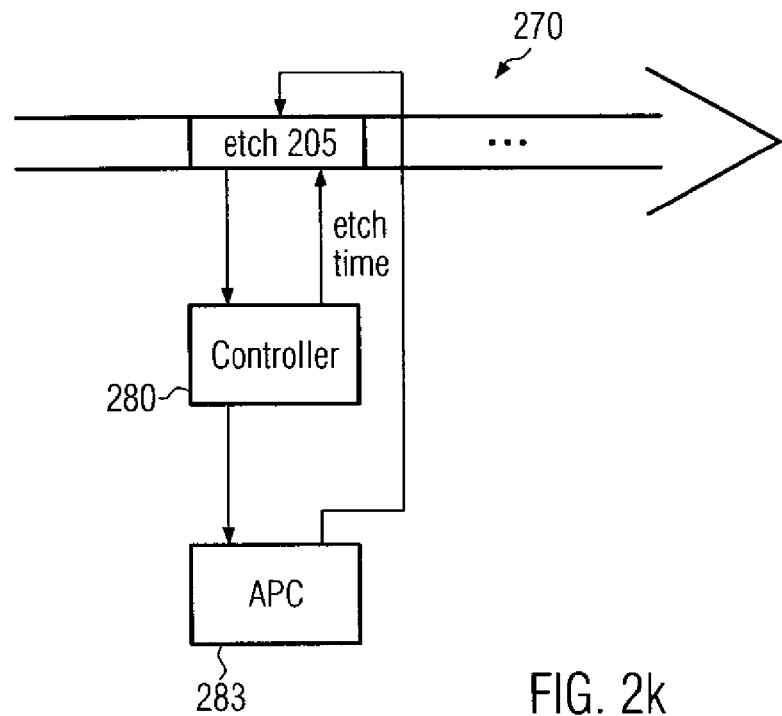

With reference to FIGS. 2j-2k, further illustrative embodiments will now be described, in which the etch conditions during the process 205 may be obtained by optical measurement data in a substantially real time manner, thereby significantly enhancing the responsiveness of a corresponding control mechanism with respect to etch rate fluctuations and the like.

FIG. 2h schematically illustrates the semiconductor device 200 during the etch process 205 wherein, for convenience, the respective measurement site 260 is shown. The measurement site 260 may be probed by the incident optical beam 261 having appropriate optical characteristics, such as wavelength, polarization and the like, in order to obtain appropriate information on the continuously decreasing thickness of the layer 240 during the process 205. For instance, in one illustrative embodiment, the incident beam 261 may be reflected by the various interfaces formed by the layers 240 and 230 and an underlying material, thereby generating the reflective beam 262, in which a difference in optical path length may result in a corresponding intensity variation caused by interference effects. The respective optical response may therefore be dependent on the wavelength of the incident beam 261 and the optical characteristics of the layers 240, 230 and any underlying material forming an interface with the layer 230. Thus, by observing the corresponding intensity variation, a respective change of the layer thickness caused by the process 205 may be detected and may therefore indicate the momentary etch rate of the process 205. It should be appreciated that the optical characteristics of the layers 240, 230 may be very similar in some embodiments due to substantially identical atomic species incorporated therein. In this case, the change of the composite layer thickness of the layers 240, 230 may be observed on the basis of the reflective beam 262.

The measurement site 260 may be appropriately positioned on the respective substrates so that it may be accessible during the etch process 205, thereby providing in-line detection and monitoring of the corresponding change of layer thickness and, thus, of the momentary etch rate.

FIG. 2i schematically illustrates a plot depicting the variation of intensity of the reflective beam 262 over time for two different etch processes performed on the basis of substantially the same recipe of the etch process 205. Curve A represents the time progression of a change of the layer thickness indicated by the beam 262 according to a relatively slow etch rate, while curve B illustrates the situation for an increased etch rate resulting in a higher frequency of the corresponding intensity variations. Based on the optical measurement data included in the reflective beam 262, a respective etch rate may be determined or any appropriate value associated therewith in order to efficiently control at least one process parameter, such as the etch time and the like, in order to obtain a desired process result. For this purpose, the respective optical measurement data, which may also be indicated as 281, may be compared with appropriate reference data or with preceding process data in order to determine an appropriate updated value of the process parameter under consideration. That is, a control loop may be established in which a deviation of the momentary etch rate may be detected and may be used to determine the updated value for appropriately controlling the process 205. For this purpose, well-known proportional, differential, integral control schemes or any combinations thereof may be used, wherein the corresponding "gain" of the respective control loop and the immediate availability of the optical measurement data 208 may provide a fast response to any etch fluctuations. In addition to the optical measurement data 281, also in this case, the respective initial layer thickness of the layer 240 may be used in order to compensate for deposition-caused thickness variations in order to substantially completely remove exposed portions of the layer 240. For example, a variation in the initial thickness of the layer 240 may be taken into consideration by a respective offset of the manipulated process parameter under consideration, such as the etch time, which in turn may be controlled in a highly dynamic manner on the basis of the optical measurement data 281. In other cases, the etch rate of the process 205 may be controlled on the basis of the optical measurement data 281 on the basis of a closed control loop as previously described, for instance, on the basis of any appropriate parameter, such as flow rate, process pressure and the like, while a variation of an initial layer thickness may be compensated for by appropriately varying the corresponding etch time of the process 205. However, other process strategies may be applied to adjust the etch process result to a desired value.

FIG. 2j schematically illustrates the process flow 270 when using the in-line or in situ measurement data 281 obtained during the etch process 205 and the controller 280 so as to appropriately adjust at least one process parameter, such as the etch time, during the currently performed etch process 205. It should be appreciated that with respect to controller stability, long term stability and the like, any appropriate mechanisms may be implemented into the controller 280 in order to substantially avoid respective oscillations in the controller behavior. For instance, the respective gain in the feedback loop may be selected moderately low, or respective damping mechanisms such as an integral component may be incorporated which may even involve several subsequent etch processes 205. In this way, a fast response during the sequence 270 may be obtained while, nevertheless, a desired degree of controller stability may be achieved.

FIG. 2k schematically illustrates a further illustrative embodiment in which the etch process 205 may be controlled on the basis of the optical measurement data 281 as illustrated in FIG. 2i so as to provide fast responsiveness, while additionally a second control loop 283 may be superimposed in order to provide appropriate long term behavior of the control strategy. For example, the controller 280 may receive the measurement data 281 and may determine an appropriate etch time so as to obtain a desired process result for the momentary etch process 205. Additionally, the controller 283 may receive the measurement results 281, indicating the momentary etch rate of the process 205, or respective measurements data, as previously described with reference to FIGS. 2c-2f, representing delayed optical measurement data, wherein the respective controller 283 may have implemented therein a respective algorithm for re-adjusting at least one process parameter for maintaining an etch rate within a desired value range. Thus, the controller 283 may, when for instance based on a model predictive algorithm, respond to long term variations of the etch process 205 whereas the controller 280 may provide the appropriate etch time for the currently processed substrate. In this way, strongly increasing or decreasing etch times may be avoided which may be caused by a continuous drift in respective etch tools for performing the process 205 which may be caused by any systematic drifts and the like. Consequently, the corresponding throughput of the associated etch tools may be maintained substantially constant while nevertheless an efficient control range for responding to etch process fluctuations and deposition-induced fluctuations may be provided.

Figure 3A:
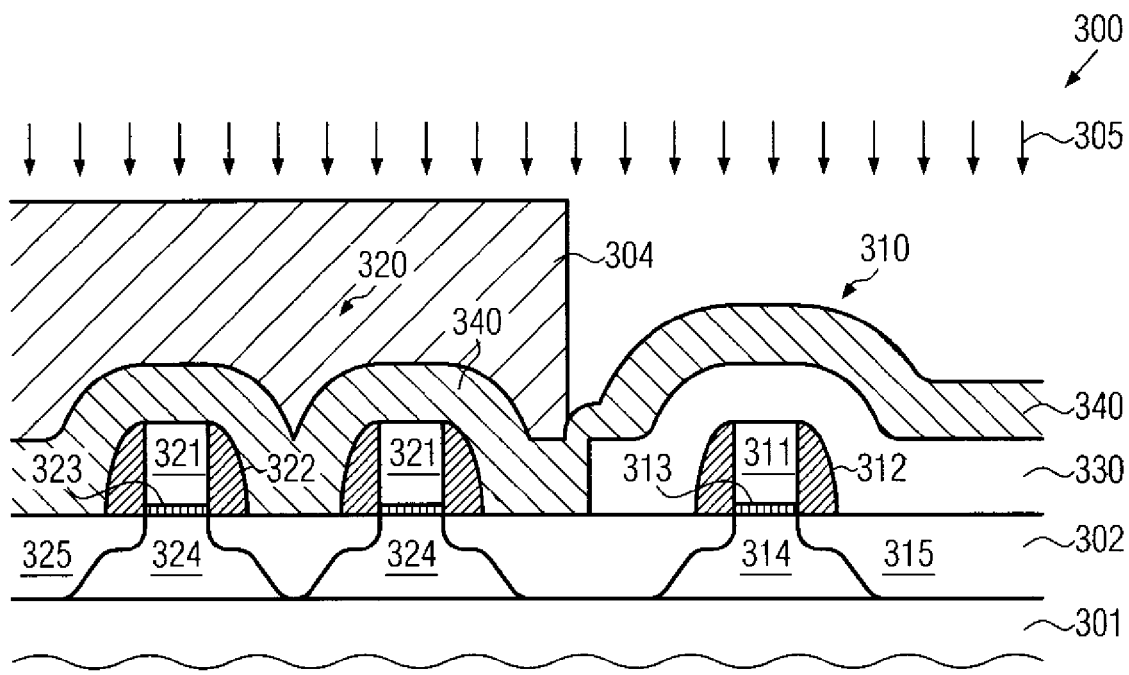
FIG. 3a schematically illustrates a cross-sectional view of a semiconductor device during the formation of different types of stress-inducing layers having a different material composition to obtain a respective distinct endpoint detection signal, according to further illustrative embodiments disclosed herein.
Figure 3B:
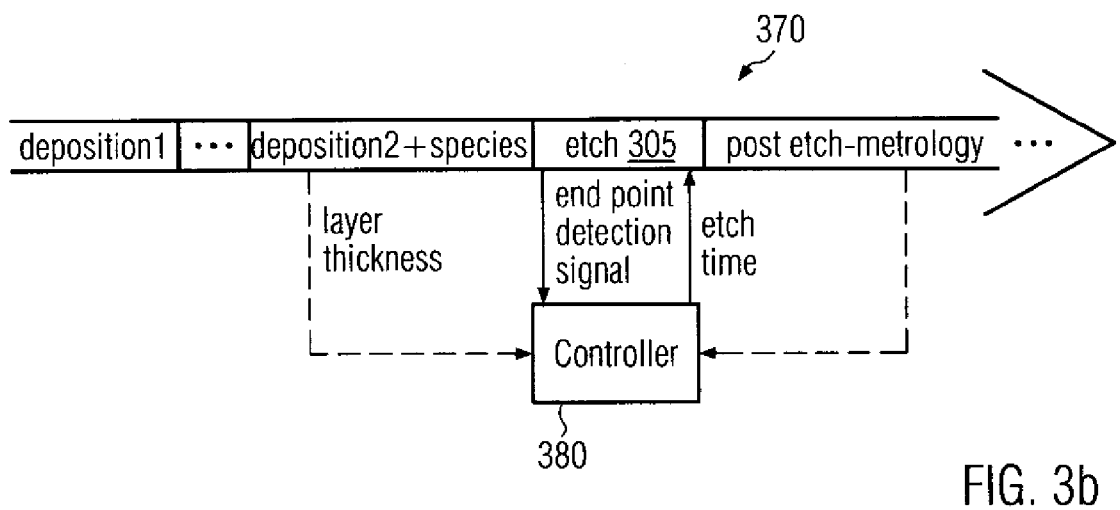
Figure 3C:
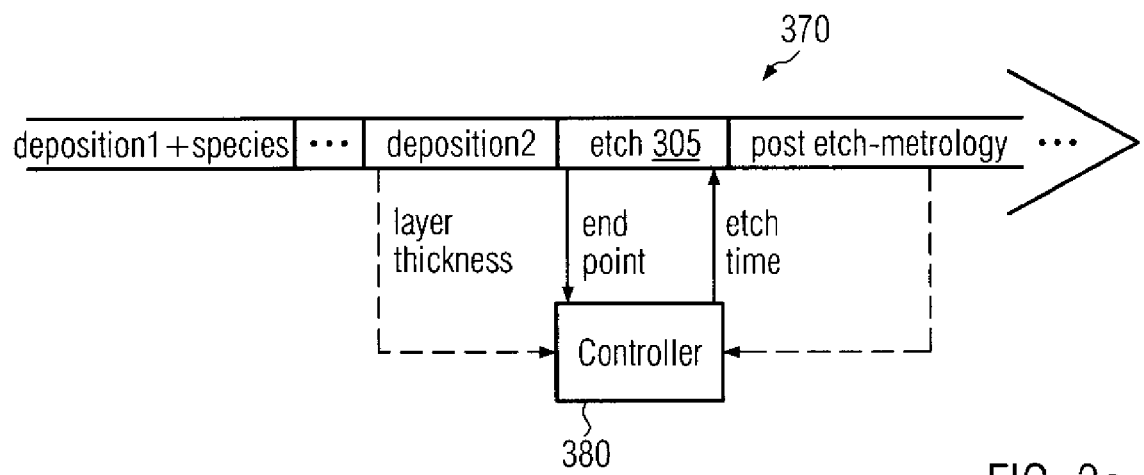

With reference to FIGS. 3a-3c, further illustrative embodiments will now be described, in which, additionally or alternatively to providing respective optical measurement data indicating the etch rate of the etch process, an etch indicator material may be incorporated into the first or the second stress-inducing layer, thereby providing the potential for creating an efficient endpoint detection signal.

FIG. 3a schematically illustrates a semiconductor device 300, which may have substantially the same configuration as the device 200 as shown in FIG. 2a, wherein, additionally, an appropriate atomic species may be provided within respective stress-inducing layers in order to create a corresponding endpoint detection signal. Hence, respective components of the semiconductor device 300 are denoted with the same reference numerals, wherein the leading digit "2" is replaced by "3" and a corresponding explanation of these components is omitted. The device 300 differs from the device as shown in FIG. 2a in that a respective atomic species 308 is incorporated in the second stress-inducing layer 340 so that a corresponding difference in releasing respective species into the etch ambient of the etch process 305 may be achieved. In one illustrative embodiment, the first stress-inducing layer 330 may be comprised of silicon nitride having a moderately high tensile stress, while the second stress-inducing layer 340 may be formed so as to exhibit a high intrinsic compressive stress. The first and second layers 330, 340 both may comprise an atomic species, such as silicon and nitrogen, possibly including hydrogen and the like. As previously explained, appropriate process recipes for depositing silicon nitride layers with high tensile stress are well established in the art. Contrary to the first layer 330, the second layer 340 may be formed on the basis of silicon and nitrogen and may include a significant amount of carbon, thereby forming a carbon-enriched silicon nitride layer or a nitrogen-enriched silicon carbide (SICN) layer, which may also be formed by PECVD techniques and may have a high compressive stress. Consequently, during the etch process 305, the carbon species may be continuously released into the etch ambient and may be detected on the basis of well-established endpoint detection techniques, wherein the carbon material may provide a prominent optical signal based upon absorption or emission spectra analysis. For example, upon a significant drop of intensity of a carbon-induced optical signal in the endpoint detection signal, a corresponding substantially complete removal of the exposed portion of the layer 340 may be identified. Thus, an appropriate endpoint of the process 305 may then be determined, thereby also maintaining the amount of material removed from the layer 330 at a low level. Furthermore, by providing a silicon, nitrogen and carbon-containing stress layer in combination with a silicon and nitrogen-containing layer, a high degree of compatibility with subsequent process steps may be maintained, for instance with respect to the etch stop characteristics of the layers 330, 340 and the like, while nevertheless the strain-inducing mechanism may be maintained with high efficiency.

In other illustrative embodiments, the atomic species 308 provided in the second layer 340 may be incorporated with low concentration with respect to the base material, such as silicon nitride, so as to not unduly affect the overall characteristics of the layer 340 with respect to etch behavior, intrinsic stress, deposition behavior and the like, while nevertheless providing a prominent endpoint detection signal. For example, appropriate precursor gases, for instance comprising metal components and the like, may be introduced with very low concentration during the deposition of a silicon nitride layer in order to obtain a substantially continuous distribution within the layer 340, which may then result in a corresponding detectable signal during the process 305.

FIG. 3b schematically illustrates the respective process flow 370 for controlling the etch process 305 on the basis of the at least one different atomic species in the layers 330 according to illustrative embodiments. During the etch process 305, the controller 380 may continuously receive the endpoint detection signal, which may have encoded therein the presence of the atomic species 308, such as carbon, thereby indicating a continuous removal of material of the layer 340. Upon detection of a depletion of the species 308 within the etch ambient, the controller 380 may then determine an appropriate overall etch time in order to substantially remove the material 340 while not unduly removing material of the layer 330 in the first device region 310. In some illustrative embodiments, additionally, the controller 380 may receive respective post-etch metrology measurement data, such as the optical measurement data as previously described with reference to FIGS. 2a-2k, in order to determine and compensate for etch rate variations, as previously described. Furthermore, corresponding thickness data may be provided, at least for the deposition of the second layer 340, in order to enhance accuracy of the post-etch metrology data and/or take account of deposition-induced variations.

FIG. 3c schematically illustrates the process flow 370, according to another illustrative embodiment, in which, during deposition 1, i.e., the deposition of the layer 330, an appropriate atomic species may be incorporated so as to establish a difference between the layers 330 and 340, even if it comprises similar components except for the respective species 308. For instance, the first layer 330 may be provided as a nitrogen-enriched silicon carbide layer having a high compressive stress, while the second layer 340 may be provided as a tensile silicon nitride layer, wherein it should be appreciated that the corresponding device regions 310, 320 may have incorporated therein respective transistor elements requiring the appropriate strain induced by the respective layers 330, 340. Thus, in this case, the controller 380 may determine an appropriate overall etch time to obtain the desired assessed result. It should be appreciated that different atomic species may be provided during the deposition 1 and the deposition 2 so as to further enhance a difference in the optical response at an interface between the layers 330 and 340. For example, the second layer 340 may have incorporated therein a carbon species, as previously described with reference to FIG. 3b, while additionally the first layer 330, at least at a surface portion thereof, may have incorporated therein a different species, for instance at a very low concentration, which is otherwise not present in the etch ambient of the process 305. In still other illustrative embodiments, both layers 330 and 340 may be formed so as to include a very low concentration of atomic species having different absorption or emission spectra, thereby providing enhanced reliability of the respective endpoint detection mechanism. For instance, different wavelength ranges may be monitored and an appropriate end of the etch process may be determined on the basis of both wavelength ranges, thereby reducing any interferences, such as noise and the like.

As a consequence, the etch process 305 may be efficiently controlled so as to substantially completely remove the exposed portion of the material 340 while not unduly affecting the material 330, wherein well-established endpoint detection systems may be used so that enhanced process results may be obtained while not contributing to process complexity or even reducing the number of process steps due to the avoidance of an additional deposition of a silicon dioxide based etch indicator material.

With reference to FIGS. 4a-4d, further illustrative embodiments will now be described in which an appropriate etch indicator material other than silicon dioxide may be formed in a thin surface area of the first stress-inducing layer or may be formed as a separate thin material layer, i.e., of a material layer having a thickness of approximately 5 nm and significantly less, on top of a first stress-inducing layer.

Figure 4A:
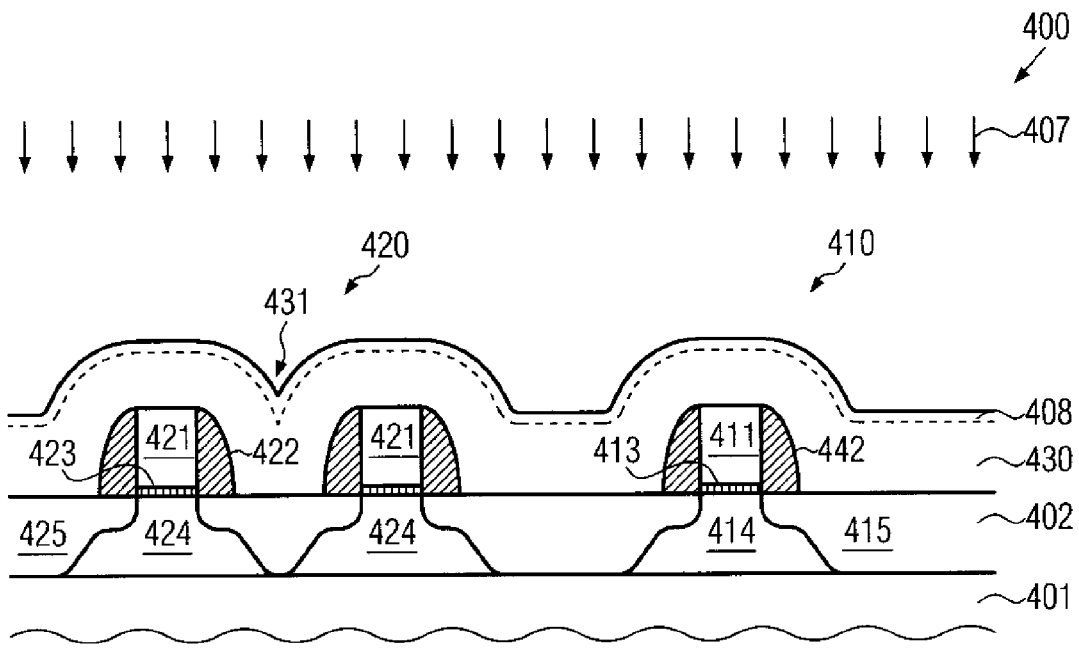
FIGS. 4a-4c schematically illustrate cross-sectional views of a semiconductor device when forming an etch indicator material with reduced thickness and/or concentration to avoid deleterious effects during the further processing, according to still other illustrative embodiments disclosed herein.

FIG. 4a schematically illustrates a cross-sectional view of a semiconductor device 400 comprising a substrate 401, a semiconductor layer 402 and respective first and second device regions 410, 420, similar to the previously described semiconductor devices 100, 200 and 300. The respective transistor elements in the first and second device regions 410, 420 may have substantially the same configuration as previously described and, hence, a description of these components will be omitted. Furthermore, in this manufacturing stage, a first stress-inducing layer 430 may be formed above the first and second device regions 410, 420, wherein the layer 430 may have a configuration as previously described with reference to the respective layers 130, 230 and 330. Moreover, the semiconductor device 400 may, in one embodiment, be subjected to a process 407 for incorporating an indicator species 408 into a thin surface area of the layer 430. That is, the indicator species 408 is introduced into the layer 430 to a depth of, for example, approximately 5 nm and significantly less, or the treatment 407 may result in a respective surface layer having a thickness of 5 nm and less. For example, the process 407 may represent a low energy implantation or may represent a plasma treatment performed on the basis of process parameters, such as implantation energy, plasma power and the like, adjusted to obtain a low mean penetration depth for the species 408, thereby resulting in a layer thickness according to the above-specified range. The species 408 may represent any appropriate species providing an efficiently detectable endpoint detection signal, even if provided in a moderately low concentration. Consequently, the incorporation of the species 408 by the process 407 may not significantly modify the overall characteristics of the layer 430.

Thereafter, the layer 430 may be removed from the second device region 420 on the basis of a process strategy, as previously explained. During the corresponding material removal, any undue effects of the species 408 may be maintained at a low level due to the moderately low concentration and/or due to the reduced layer thickness so that the corresponding etch process may progress with high uniformity, even at critical areas, such as an area 431.

In some illustrative embodiments, the layer thickness and/or the concentration of the species 408 may be significantly reduced by selecting any appropriate species, which may provide a well detectable endpoint detection signal, wherein the mechanism for incorporating the species 408, such as ion implantation and plasma treatment, may provide a high degree of flexibility in using appropriate candidates, even very exotic species, such as metals and the like. Appropriate process parameters for the process 407 may be readily established on the basis of simulation, test runs and the like. In some illustrative embodiments, the treatment 407 may result in a layer thickness or average penetration depth of 2 nm and less, thereby providing a moderately sharp endpoint detection signal when using respective etch rates of approximately several Angstrom per second.

Figure 4B:
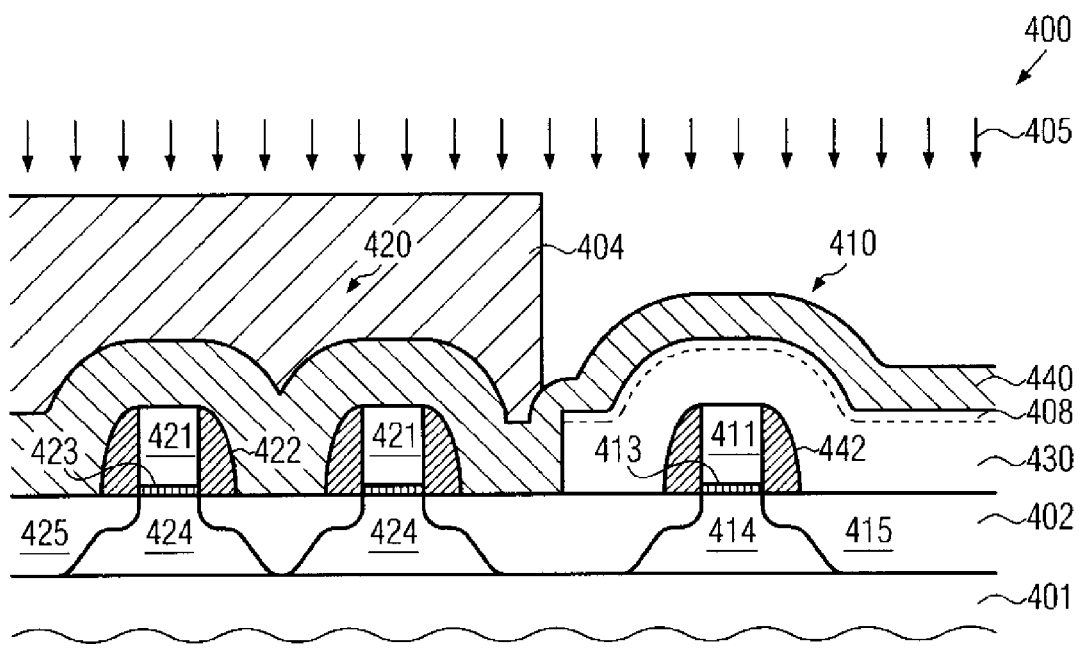

FIG. 4b schematically illustrates the semiconductor device 400 in a further advanced manufacturing state. A second stress-inducing layer 440 is formed above the second device region 420 and on the first layer 430, which has incorporated therein the species 408 down to a depth of 5 nm and less. Furthermore, an etch mask 404 covers the second device region 420 during a respective etch process 405 for removing the exposed portion of the layer 440. During the etch process 405, the indicator species 408 is released and generates the corresponding etch point detection signal, which may then be used for defining an appropriate end of the process 405. Hence, depending on the control strategy, the surface layer comprising the indicator species 408 may also be removed, which, however, may not significantly affect the overall characteristics of the layer 430. Furthermore, a corresponding loss of material of the layer 430 may be compensated for by respectively adjusting the initial layer thickness thereof.

Figure 4C:
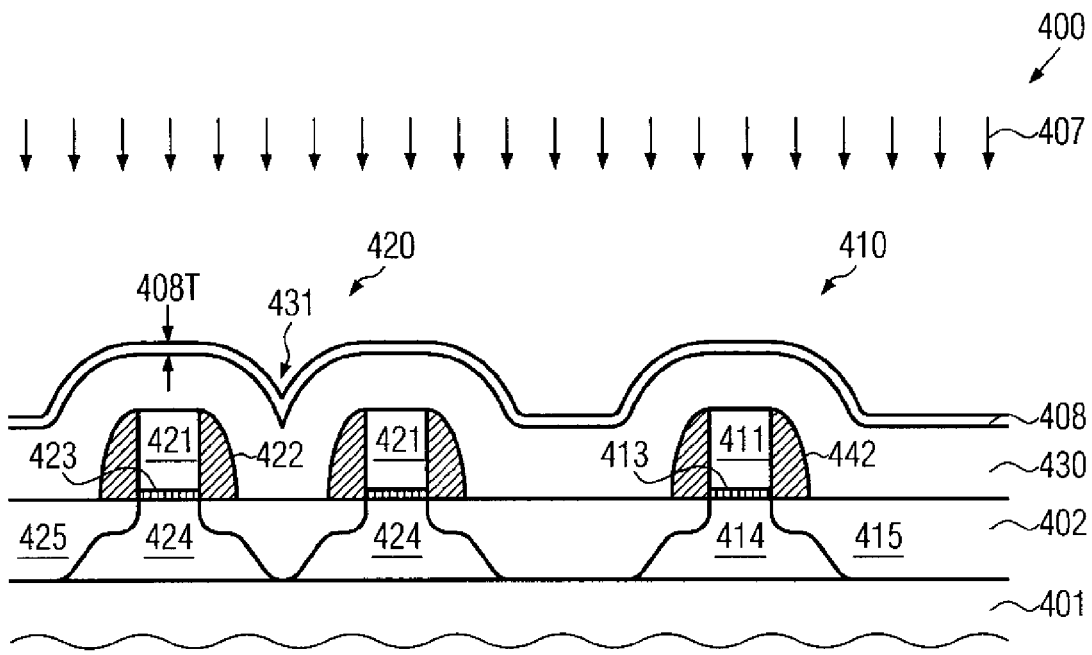

FIG. 4c schematically illustrates the semiconductor device 400 according to a further illustrative embodiment, in which the indicator material 408 is provided in the form of a thin layer, also indicated as 408, deposited on the basis of any appropriate deposition technique, such as chemical vapor deposition (CVD), physical vapor deposition (PVD) and the like, wherein the respective thickness 408T is approximately 5 nm and less, thereby reducing any adverse effect on the overall behavior of the layer 430. Furthermore, the material composition of the layer 408 may be selected so as to be substantially "transparent" for the further processing of the device 400, that is, the overall characteristics of the layer 408 may substantially correspond to the characteristics of the layer 430, or may be similar thereto. In some illustrative embodiments, the material composition of the layer 408 may be selected so that at least one atomic species is incorporated, which may otherwise not be present in the respective ambient created during the subsequent etch process 405. Also, during the deposition process 407, any exotic species may be incorporated so that a layer thickness of 5 nm and significantly less, such as 2 nm or less, may be sufficient for obtaining a respective prominent endpoint detection signal. It should be appreciated that the deposition process 407 may not require a high degree of step coverage or conformity, since even a respective non-continuous layer may provide the required endpoint detection signal due to the presence of an appropriate atomic species. Thus, with well-established conventional deposition techniques, such as CVD, PVD and the like, extremely thin layers may be obtained so as to not unduly negatively affect the further processing of the device 400, while nevertheless providing a desired etch control.

Figure 4D:
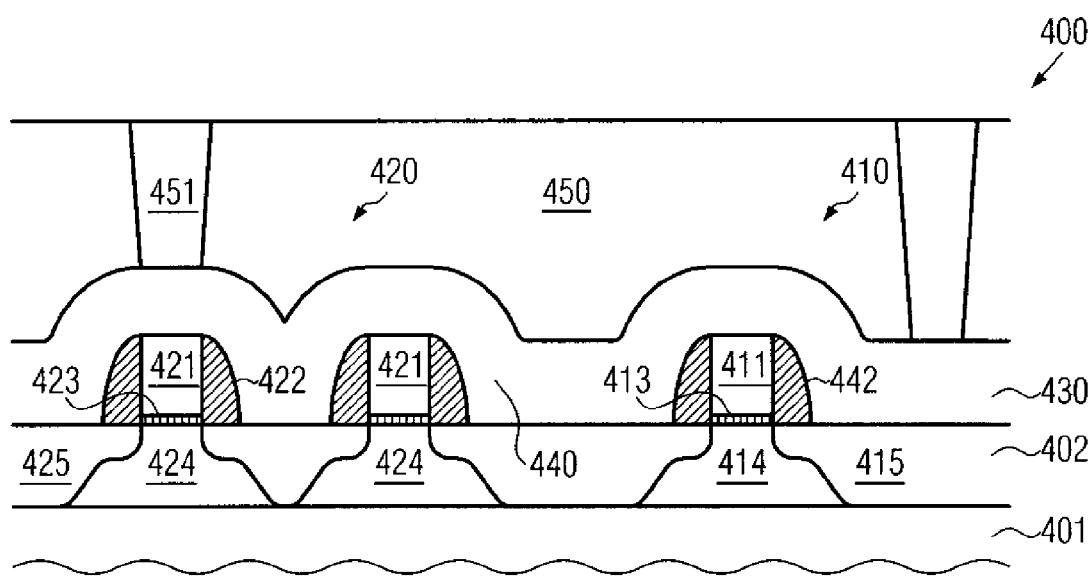
FIG. 4d schematically illustrates the semiconductor device in a further advanced manufacturing stage in which respective contact openings are formed in a dielectric material, wherein the stress-inducing layers are used as etch stop layers.

FIG. 4d schematically illustrates the semiconductor device 400 in a further advanced manufacturing stage, in which a further dielectric material 450 is formed above the first and second layers 430, 440, wherein, in this manufacturing stage, respective openings 451 are formed in the material 450. In some illustrative embodiments, the first and second layers 430, 440 may be used as etch stop layers for controlling a respective etch process for etching through material 450. Due to the enhanced uniformity of the corresponding patterning process for forming the layers 430, 440, the respective etch stop capabilities may be provided in a highly uniform manner, and also, in a subsequent etch process for opening the respective layers 430, 440, an enhanced process uniformity may be obtained, thereby substantially avoiding or at least significantly reducing the problems encountered in the conventional strategy as previously explained.

As a result, the embodiments disclosed herein provide an enhanced process strategy in forming differently stressed dielectric layers, such as silicon nitride based layers, above respective transistor elements, wherein negative influences of a deposition process conventionally performed to provide an etch indicator layer may be significantly reduced. For this purpose, the deposition process may, in some embodiments, be omitted and the corresponding patterning process for removing unwanted portions of the second stress-inducing layer may be performed on the basis of an enhanced control strategy, for instance, based on optical feedback and/or feed forward measurement data, thereby taking into consideration respective process fluctuations during the deposition of the stress-inducing layer and any fluctuations of the etch process. The optical feedback data may be obtained on the basis of scatterometry and/or interferometric measurement techniques. The measurement data may then be used in an APC technique to control at least one process parameter, such as etch time, flow rates and the like, for obtaining the desired process result. In other aspects, the endpoint detection mechanism may be enhanced during the patterning of the stress-inducing layers by providing an appropriate indicator species, for instance, by providing an appropriate composition of one of the stress-inducing layers to create a respective difference in the optical endpoint detection signal without providing an additional indicator layer between the respective stressed layers. In still other illustrative embodiments, a highly efficient etch indicator material may be provided in the form of a very thin surface layer, formed by surface modification and/or a deposition, with a thickness of approximately 5 nm or significantly less, wherein the reduced layer thickness and/or the reduced concentration may provide a high degree of compatibility with the subsequent process flow, while nevertheless providing a prominent endpoint detection signal. These concepts may also be efficiently combined with the above-described enhanced control strategies on the basis of optical measurement data. Consequently, the negative influence of silicon dioxide based etch indicator layers may be reduced or avoided, substantially without adding to additional process complexity, or even reducing the overall complexity, compared to conventional techniques.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a first stress-inducing layer above a first transistor and a second transistor, said first and second transistors formed above a first substrate;
   removing a portion of said first stress-inducing layer located above said second transistor;
   forming a second stress-inducing layer on said first stress-inducing layer and above a measurement site;
   removing a first portion of said second stress-inducing layer from above said first transistor on the basis of an etch process;
   forming a test structure including a grating pattern at said measurement site by etching a second portion of said second stress-inducing layer to define said grating pattern; and
   controlling at least one parameter of said etch process on the basis of optical measurement data collected from said grating pattern at said measurement site, said optical measurement data indicating an etch rate of said etch process.

2. The method of claim 1, further comprising controlling said etch process on the basis of measurement data indicating a layer thickness of said second stress-inducing layer.

3. The method of claim 1, further comprising forming an etch stop layer above said first and second transistors prior to forming said first stress-inducing layer.

4. The method of claim 1, wherein said first and second stress-inducing layers are comprised of silicon nitride.

5. The method of claim 1, further comprising forming a dielectric material above said first and second transistors after said etch process, and forming contacts in said dielectric material using said first and second stress-inducing layers as an etch stop.

6. The method of claim 1, wherein said at least one parameter comprises an etch time of said etch process.

7. The method of claim 1, wherein controlling at least one parameter comprises using a model of said etch process and estimating an updated value for said at least one parameter on the basis of said model and said optical measurement data.

8. The method of claim 1, wherein forming said test structure including said grating pattern at said measurement site further comprises etching a series of alternating lines and spaces in said second stress-inducing layer.

9. The method of claim 1, wherein forming said test structure including said grating pattern at said measurement site further comprises:
   etching a plurality of lines in said first stress-inducing layer;
   forming said second stress-inducing layer over said plurality of lines; and
   etching portions of said second stress-inducing layer between adjacent lines during said etch process.

10. The method of claim 1, wherein controlling said etch time comprises monitoring a thickness of said second stress-inducing layer to obtain said optical measurement data when etching said second stress-inducing layer.

11. The method of claim 10, wherein monitoring a thickness of said second stress-inducing layer comprises performing an interferometric measurement process.

12. The method of claim 1, wherein said test structure is formed based on said first and second stress-inducing layers above a second substrate and said optical measurement data is obtained by a scatterometry measurement process performed on said test structure.

13. The method of claim 12, wherein forming said test structure comprises patterning one of said first and second stress-inducing layers to form said grating pattern.

14. The method of claim 12, further comprising obtaining further optical measurement data from said test structure, said further optical measurement data indicating at least a thickness of said second stress-inducing layer prior to performing said etch process.

15. The method of claim 1, further comprising providing a specified atomic species in one of the first and second stress-inducing layers and controlling said etch process further on the basis of an optical signal obtained from said specified atomic species during said etch process.

16. The method of claim 15, wherein said atomic species comprises carbon.

17. The method of claim 16, wherein said second stress-inducing layer comprises said carbon and has intrinsic compressive stress.

18. The method of claim 16, wherein said first stress-inducing layer comprises said carbon and has intrinsic compressive stress.

* * * * *